United States Patent
Mizuno et al.

(10) Patent No.: US 8,410,619 B2
(45) Date of Patent: Apr. 2, 2013

(54) GRANULAR EPOXY RESIN COMPOSITION FOR ENCAPSULATING SEMICONDUCTOR, SEMICONDUCTOR DEVICE USING THE SAME AND METHOD FOR PRODUCING SEMICONDUCTOR DEVICE

(75) Inventors: Yasuhiro Mizuno, Tokyo (JP); Kazuya Shigeno, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/133,800

(22) PCT Filed: Dec. 2, 2009

(86) PCT No.: PCT/JP2009/006532
§ 371 (c)(1),
(2), (4) Date: Jun. 9, 2011

(87) PCT Pub. No.: WO2010/067538
PCT Pub. Date: Jun. 17, 2010

(65) Prior Publication Data
US 2011/0241188 A1    Oct. 6, 2011

(30) Foreign Application Priority Data

Dec. 10, 2008  (JP) ................... P2008-314064
Dec. 10, 2008  (JP) ................... P2008-314065

(51) Int. Cl.
*H01L 23/29*    (2006.01)
(52) U.S. Cl. . 257/788; 257/787; 257/793; 257/E23.116; 257/E23.119; 257/E21.502

(58) Field of Classification Search .............. 257/787, 257/788, 793, E23.116, E23.119, E21.502
See application file for complete search history.

(56) References Cited

U.S. PATENT DOCUMENTS

| 6,120,716 A | 9/2000 | Kushida et al. |
| 7,348,220 B2 * | 3/2008 | Ito et al. ............ 438/127 |
| 2008/0029933 A1 * | 2/2008 | Higashiizumi et al. .... 264/328.1 |

FOREIGN PATENT DOCUMENTS

| JP | 2000-21908 A | 1/2000 |
| JP | 3135926 B2 | 2/2001 |
| JP | 2003-285319 A | 10/2003 |
| JP | 2004-216558 A | 8/2004 |
| JP | 2006-216899 A | 8/2006 |
| JP | 2008-121003 A | 5/2008 |

OTHER PUBLICATIONS

International Search Report, PCT/JP2009/006532, Feb. 9, 2010.

* cited by examiner

*Primary Examiner* — Jasmine Clark
(74) *Attorney, Agent, or Firm* — Birch, Stewart, Kolasch & Birch, LLP

(57) ABSTRACT

Disclosed is a granular epoxy resin composition for encapsulating a semiconductor used for a semiconductor device obtained by encapsulating a semiconductor element by compression molding, wherein, in the particle size distribution as determined by sieving the whole epoxy resin composition for encapsulating a semiconductor using JIS standard sieves, the ratio of particles having a size of 2 mm or greater is not more than 3% by mass, the ratio of particles having a size of 1 mm or greater, but less than 2 mm is from 0.5% by mass or more to 60% by mass or less, and the ratio of microfine particles having a size of less than 106 μm is not more than 5% by mass.

9 Claims, 11 Drawing Sheets

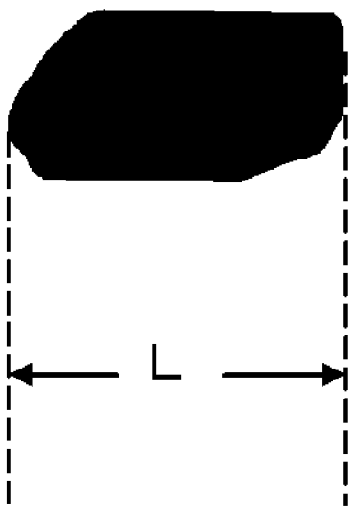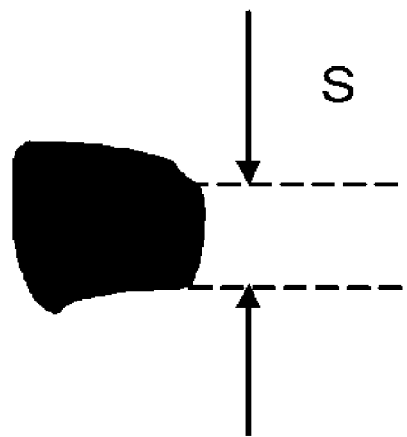
Fig. 3 (A) LONGEST LENGTH (L)  Fig. 3 (B) SHORTEST LENGTH (S)

t : THICKNESS OF ENCAPSULATION MATERIAL ON SEMICONDUCTOR ELEMENT

GRANULAR EPOXY RESIN COMPOSITION FOR ENCAPSULATING SEMICONDUCTOR, SEMICONDUCTOR DEVICE USING THE SAME AND METHOD FOR PRODUCING SEMICONDUCTOR DEVICE

TECHNICAL FIELD

The present invention relates to a granular epoxy resin composition for encapsulating a semiconductor which is suitable for encapsulating a semiconductor element by compression molding, a semiconductor device using the granular epoxy resin composition and a method for producing a semiconductor device.

BACKGROUND ART

As a method of encapsulation molding of a semiconductor device using an epoxy resin composition for encapsulating a semiconductor (hereinafter referred to as the epoxy resin composition or the resin composition), there has been generally used transfer molding using a tablet obtained by forming a solid epoxy resin composition in a cylindrical shape. However, in recent years, as a new molding method, there has been reviewed a compression molding method used for encapsulation. Since macro-flow of a molten resin in this compression molding method is smaller as compared to the conventional transfer molding, this method has been paid attention to as a method of minimizing wire sweep with respect to a semiconductor device in which a lead frame or a circuit board and a semiconductor element are connected by means of fine pitch wires, long wires, small diameter wires or the like.

As a technique relating to a semiconductor device obtained by encapsulating a semiconductor element by compression molding, there have been disclosed a method comprising encapsulating with a resin by compression molding while reducing the pressure in a mold (for example, refer to Patent Document 1), a method comprising using an encapsulation molding material having a thickness of not more than 3.0 mm in a pellet shape or a sheet shape (for example, refer to Patent Document 2), a method comprising supplying a granular resin composition into a cavity, melting the resin composition, immersing a semiconductor element therein, and curing the resin composition for encapsulating the semiconductor element (for example, refer to Patent Document 3), and the like.

One example of a method of encapsulating a semiconductor element using a granular resin composition by compression molding will be described in more detail with reference to FIGS. 1 and 2 illustrating a schematic diagram of a method of weighing of the granular resin composition and supplying it into a mold cavity. A granular resin composition 103 is conveyed in a predetermined quantity using a conveyance means such as a vibration feeder 101 or the like onto a resin material supplying container 102 equipped with a resin material supplying mechanism such as a shutter or the like capable of supplying the resin composition into a lower cavity 104 in an instant, whereby the resin material supplying container 102 containing the granular resin composition 103 is prepared (see FIG. 1). At this time, the granular resin composition 103 contained in the resin material supplying container 102 can be weighed by a weighing means arranged below the resin material supplying container 102. Next, the resin material supplying container 102 containing the granular resin composition 103 is arranged between an upper die and a lower die of a compression mold, and a lead frame or a circuit board on which a semiconductor element is mounted is fixed on the upper die of the compression mold by a fixing means such as a clamp, adsorption or the like such that a semiconductor element-mounted surface is directed downward (not illustrated). Further, when a lead frame or a circuit board is provided with portions piercing through, a surface opposite to the semiconductor element-mounted surface is subjected to lining using a film or the like.

Subsequently, when the weighed granular resin composition 103 is supplied into the lower cavity 104 by use of the resin material supplying mechanism such as a shutter or the like constituting the bottom surface of the resin material supplying container 102 (see FIG. 2), the granular resin composition 103 is melted in the lower cavity 104 at a predetermined temperature. Furthermore, after the resin material supplying container 102 is taken out of the mold, while reducing the pressure in the cavity as necessary, the mold is closed by use of a compression molding machine, the inside of the cavity is filled with the melted resin composition so as to surround the semiconductor element and the resin composition is further cured for a predetermined period of time, whereby the semiconductor element is encapsulated and molded. After elapsing a predetermined period of time, the semiconductor device is taken out by opening the mold. Incidentally, it is not essentially required to perform degassing by reducing the pressure in the cavity, but degassing is preferable because voids in the cured product of the resin composition are reduced. Furthermore, a plurality of semiconductor elements may be mounted on the lead frame or the circuit board, and may be laminated or mounted in parallel thereon.

In the technical field of such compression molding, there have been proposed a review of the particle size distribution (for example, refer to Patent Document 4), a review of resin properties (for example, refer to Patent Document 5) and the like, as a method to solve clogging or blocking (adherence) during conveyance, weighing or the like. However, it is not sufficient to solve the problem of productivity caused by uneven sprinkling, conveyance performance or the like, just by specifying the broad particle size distribution or selecting a resin hardly causing blocking. Further, in case that a resin is restricted to those which can be used in view of blocking, there have been problems such that the degree of freedom in formulation is low and the application range of the target semiconductor device is low.

RELATED DOCUMENTS

Patent Documents

Patent Document 1: Japanese Patent Application Laid-Open No. 2000-021908
Patent Document 2: Japanese Patent Application Laid-Open No. 2006-216899
Patent Document 3: Japanese Patent Application Laid-Open No. 2004-216558
Patent Document 4: Japanese Patent No. 3135926
Patent Document 5: Japanese Patent Application Laid-Open No. 2008-121003

DISCLOSURE OF THE INVENTION

The present invention provides a granular epoxy resin composition for encapsulating a semiconductor excellent in the productivity and a semiconductor device excellent in the reliability, in case that a semiconductor device is obtained by encapsulating a semiconductor element by compression molding using the granular epoxy resin composition for encapsulating a semiconductor.

According to the present invention, provided is a granular epoxy resin composition for encapsulating a semiconductor used for a semiconductor device obtained by encapsulating a semiconductor element by compression molding, wherein, in the particle size distribution as determined by sieving said whole granular epoxy resin composition for encapsulating a semiconductor using JIS standard sieves, the ratio of particles having a size of 2 mm or greater is not more than 3% by mass, the ratio of particles having a size of 1 mm or greater, but less than 2 mm is from 0.5% by mass or more to 60% by mass or less, and the ratio of microfine particles having a size of less than 106 μm is not more than 5% by mass.

Also, according to the present invention, provided is a granular epoxy resin composition for encapsulating a semiconductor used for a semiconductor device obtained by encapsulating a semiconductor element by compression molding, wherein, in the particle size distribution as determined by sieving the whole granular epoxy resin composition for encapsulating a semiconductor using JIS standard sieves, the ratio of coarse particles having a size of 2 mm or greater is not more than 3% by mass, the ratio of microfine particles having a size of less than 106 μm is not more than 5% by mass, and the ratio (D1/D2) of the granule density D1 of the epoxy resin composition for encapsulating a semiconductor to the specific gravity D2 of a cured product after curing the epoxy resin composition for encapsulating a semiconductor is in the range of 0.88 or more to 0.97 or less.

EFFECT OF THE INVENTION

According to the present invention, it is possible to achieve a granular epoxy resin composition for encapsulating a semiconductor excellent in the productivity and a semiconductor device excellent in the reliability, in case that a semiconductor device is obtained by encapsulating a semiconductor element by compression molding using the granular epoxy resin composition for encapsulating a semiconductor.

BRIEF DESCRIPTION OF THE DRAWINGS

The above and other objects, features and advantages will be apparent from the following detailed description of the preferred embodiments in conjunction with the accompanying drawings.

FIG. 3(A) is a view illustrating the longest part observed directly from the side of one particle of a granular resin composition.

FIG. 3(B) is a view illustrating the shortest part observed directly from the side of one particle of the granular resin composition.

DESCRIPTION OF EMBODIMENTS

Figure 1:
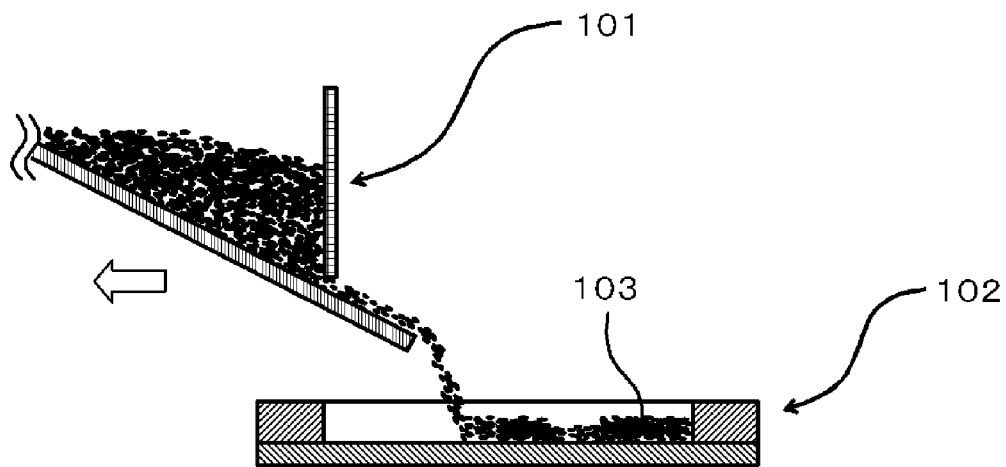
FIG. 1 is a schematic diagram of one example from conveyance to weighing in a method for obtaining a semiconductor device obtained by encapsulating a semiconductor element by compression molding using a granular resin composition.

First Granular Epoxy Resin Composition for Encapsulating Semiconductor

A first granular epoxy resin composition for encapsulating a semiconductor is used for a semiconductor device obtained by encapsulating a semiconductor element by compression molding, and comprises the following constructions:

A: in the particle size distribution as determined by sieving the whole granular epoxy resin composition for encapsulating a semiconductor using JIS standard sieves, the ratio of particles having a size of 2 mm or greater is not more than 3% by mass;

X1: the ratio of particles having a size of 1 mm or greater, but less than 2 mm is from 0.5% by mass or more to 60% by mass or less; and B: the ratio of microfine particles having a size of less than 106 μm is not more than 5% by mass.

Furthermore, the first granular epoxy resin composition for encapsulating a semiconductor comprises the following constructions:

X2: in the particle size distribution as determined by sieving the first granular epoxy resin composition for encapsulating a semiconductor using JIS standard sieves, the ratio of particles having the longest length (L) of not more than 5 mm and the shortest length (S) of not more than 1 mm is not less than 50% by mass, based on particles having a size of not less than 106 μm; and X3: the collapse angle of the first granular epoxy resin composition for encapsulating a semiconductor is not more than 35 degrees.

Second Granular Epoxy Resin Composition for Encapsulating Semiconductor

A second granular epoxy resin composition for encapsulating a semiconductor is used for a semiconductor device obtained by encapsulating a semiconductor element by compression molding, and comprises the following constructions:

A: in the particle size distribution as determined by sieving the whole granular epoxy resin composition for encapsulating a semiconductor using JIS standard sieves, the ratio of coarse particles having a size of 2 mm or greater is not more than 3% by mass;

B: the ratio of microfine particles having a size of less than 106 μm is not more than 5% by mass; and Y1: the ratio (D1/D2) of the granule density D1 of the epoxy resin composition for encapsulating a semiconductor to the specific gravity D2 of a cured product after curing the epoxy resin composition for encapsulating a semiconductor is in the range of 0.88 or more to 0.97 or less.

Furthermore, the second granular epoxy resin composition for encapsulating a semiconductor comprises the following constructions:

Y2: the granule density D1 of the second granular epoxy resin composition for encapsulating a semiconductor is not more than 1.95.

First, the constructions A and B common in the first and second granular epoxy resin compositions for encapsulating a semiconductor will be described.

Construction A

For the granular epoxy resin composition for encapsulating a semiconductor of the present invention, in order to achieve stabilized supply performance into a compression mold and excellent weighing accuracy, in the particle size distribution as determined by sieving the whole resin composition using JIS standard sieves, the ratio of particles having a size of 2 mm or greater is preferably not more than 3% by mass and more preferably not more than 1% by mass. As the particle size is greater, its mass and volume also become greater. From such a fact, as the ratio of particles having a large size is high, weighing accuracy is reduced during weighing, which becomes a factor of deterioration in the quality of a semiconductor device after molding, so that there is a problem of clogging at a supply port to a conveyance path or the like. As a result, in case that the ratio is in the range of not more than the above upper limit, excellent weighing accuracy is achieved so that there is little risk of deteriorating the quality of a semiconductor device, and there is little risk of causing a problem of a clogging at a supply port to a conveyance path or the like. Furthermore, the lower limit of the ratio of particles (coarse particles) having a size of 2 mm or greater is not particularly limited, and it may be 0% by mass.

Construction B

Meanwhile, for the granular epoxy resin composition for encapsulating a semiconductor of the present invention, in order to achieve stabilized conveyance performance, productivity and stabilized weighing accuracy, in the particle size distribution as determined by sieving the whole resin composition using JIS standard sieves, the ratio of microfine particles having a size of less than 106 μm is preferably not more than 5% by mass and more preferably not more than 3% by mass. Particles having a size of less than 106 μm cause adhesion of the granular resin composition during storage, adhesion among particles on the conveyance path of the granular resin composition, or attachment to a conveyance apparatus, which becomes a factor of causing a conveyance failure, so that there is a problem in continuous productivity or the tact time of production. As a result, in case that the ratio is in the range of not more than the above upper limit, excellent continuous productivity and stabilized productivity can be achieved without causing adhesion among particles or attachment to a conveyance apparatus. Furthermore, the lower limit of the ratio of microfine particles having a size of less than 106 μm is not particularly limited, and it may be 0% by mass.

Incidentally, as a method of measuring the particle size distribution of the granular resin composition, preferably used is a method including classifying a sample of 40 g through sieves while shaking these sieves over a period of 20 minutes (number of hammer strokes: 120/minute) employing JIS standard sieves having apertures of 2.00 mm and 106 μm installed in a ro-tap type sieve shaker, and determining % by mass of coarse particles remained in the sieve of 2.00 mm and % by mass of microfine particles passing through the sieve of 106 μm based on the mass of the sample before classifying because properties necessary for actual compression molding are realized. In the case of this method, particles having a high aspect ratio (the short diameter thereof is smaller than the aperture of the sieve, and the long diameter thereof is greater than that) are possibly passing through respective sieves, whereas, for convenience, the particle size distribution of the granular resin composition is defined according to % by mass of the components classified by a certain method.

Furthermore, the resin composition for encapsulating a semiconductor for compression molding which has been used from the past was a pulverized product obtained by premixing respective raw material components using a mixer, and then kneading with heating by use of a kneading machine such as a roller, a kneader, an extruder or the like, followed by cooling and pulverizing. In the particle size distribution as determined by sieving the whole resin composition using JIS standard sieves, the amount of microfine particles having a size of less than 106 μm exceeded 10% by mass, and the amount of coarse particles having a size of 2 mm or greater was about 4% by mass to 6% by mass, and the resin composition had a wide particle size distribution. Also, an epoxy resin molding material described in Japanese Patent Application Laid-Open No. 2000-021908 (Patent Document 1) was a coarse particle obtained by cutting pulverized fine powder or a granular resin composition obtained by solidifying fine powder, and for example, it was nearly spherical and had an average particle diameter of about 2 mm and the like. That is, the epoxy resin molding material described in Patent Document 1 contained coarse particles having a size of 2 mm or greater in a significant amount.

Next, the constructions X1 to X3 of the first granular epoxy resin composition for encapsulating a semiconductor will be described.

Construction X1

For the first granular epoxy resin composition for encapsulating a semiconductor, in order to reduce uneven sprinkling onto a compression mold due to a variation in the supply of the granular resin composition, in the particle size distribution as determined by sieving the whole resin composition using JIS standard sieves, the lower limit of the ratio of particles having a size of 1 mm or greater, but less than 2 mm is preferably not less than 0.5% by mass, more preferably not less than 5% by mass, and further preferably not less than 10% by mass. On the other hand, the upper limit is preferably not more than 60% by mass, more preferably not more than 60% by mass, and further preferably not more than 55% by mass. In case that the ratio is in the range of not more than the above upper limit, uneven sprinkling onto a mold cavity due to a supply variation can be suppressed, so that there is little risk of causing failures such as defective filling and wire sweep. Meanwhile, in case that the ratio is in the range of not less than the above lower limit, adhesion among particles or attachment to the conveyance path may not occur due to an increase in small particle size components and there is little risk of causing trouble in conveyance. Furthermore, in case that the ratio is within the above numerical range, stabilized productivity and moldability can be achieved.

Incidentally, as a method of measuring the particle size distribution of the first granular epoxy resin composition for encapsulating a semiconductor, preferably used is a method including classifying a sample of 40 g through sieves while shaking these sieves over a period of 20 minutes (number of hammer strokes: 120/minute) employing JIS standard sieves having apertures of 2.00 mm, 1.00 mm and 106 μm installed in a ro-tap type sieve shaker, and determining % by mass of particles remained in sieves of 2.00 mm and 1.00 mm and % by mass of microfine particles passing through the sieve of 106 μm based on the total sample mass before classifying because properties necessary for actual compression molding are realized. In the case of this method, particles having a high aspect ratio are possibly passing through respective sieves, whereas, for convenience, respective particle size distributions of the granular resin composition of the present invention are defined according to % by mass of the components classified under the above-mentioned certain conditions.

Construction X2

Figure 4:
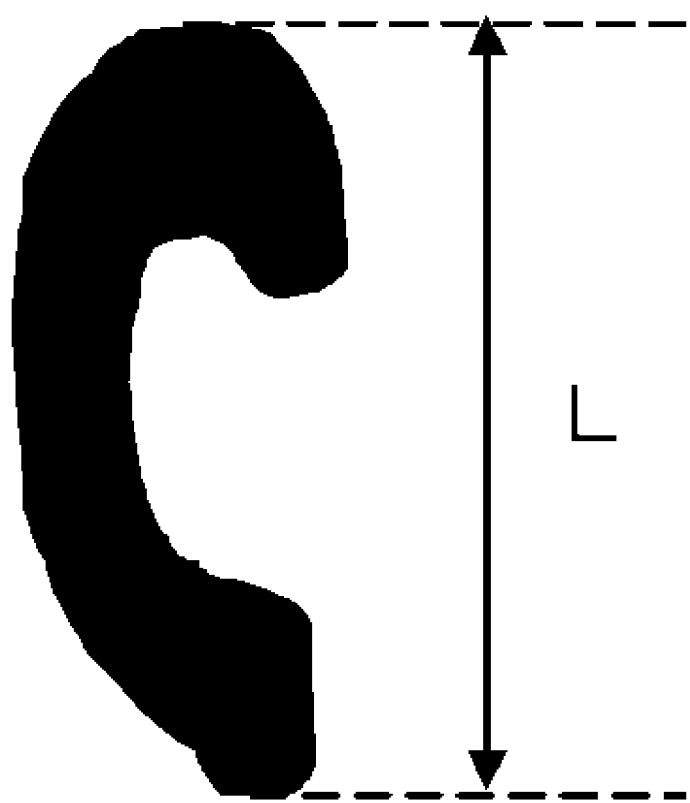
FIG. 4 is a view illustrating the longest part of one bent particle of a granular resin composition.

Meanwhile, in the first granular epoxy resin composition for encapsulating a semiconductor, from the viewpoints of conveyance performance by a conveyance means such as a vibration feeder or the like and melting properties upon compression molding, the ratio of particles having the longest length (L) of not more than 5 mm and the shortest length (S) of not more than 1 mm is preferably not less than 50% by mass and more preferably not less than 80% by mass based on the total particles having a size of not less than 106 μm. In case that the ratio is within the above numerical range, conveyance performance causing uneven sprinkling and melting properties can be balanced, and stabilized productivity and moldability can be achieved. Furthermore, in case that the ratio of particles having the longest length (L) of exceeding 5 mm is small, there is little risk of causing failures such as a reduction in a supply speed during conveyance, clogging at a supply port to a conveyance path and the like. Or, in case that the ratio of particles having the shortest length (S) of exceeding 1 mm is small, there is little risk of causing failures such as a variation in the solubility in case that the resin composition is put into a mold cavity and the like. Incidentally, as a method of measuring the longest length (L) and the shortest length (S), particles having a size of not more than 106 μm are removed by sieving the granular resin composition using the aforementioned JIS standard sieves, 100 particles are randomly selected from particles having a size of more than 106 μm, and the longest length (L) and the shortest length (S) of each single particle are measured using a microscope equipped with a vernier caliper or scale. After particles having the longest length (L) of not more than 5 mm and the shortest length (S) of not more than 1 mm, and other particles are sorted out, the mass of particles having the longest length (L) of not more than 5 mm and the shortest length (S) of not more than 1 mm is measured and the ratio thereof to the total mass of a measuring sample (% by mass) is determined, which can be represented as the value of the total resin composition. Furthermore, as shown in FIGS. 3A and 3B, for each single particle, the longest part is taken as the longest length (L), while the shortest part is taken as the shortest length (S). As shown in FIG. 4, when a particle shape is bent, the longest part of the straight-line distance may be measured.

Construction X3

Figure 5:
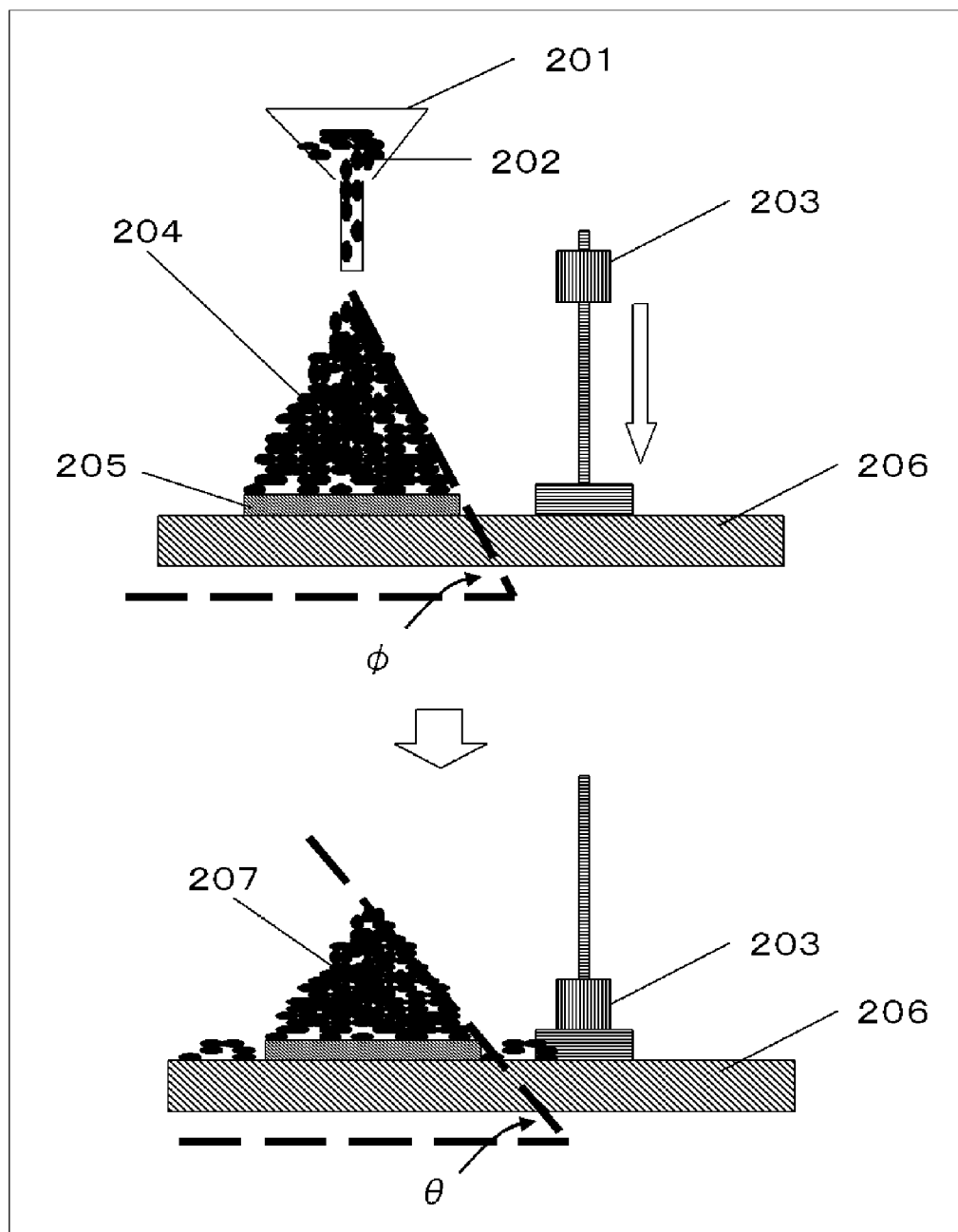
FIG. 5 is a schematic diagram illustrating a method of measuring a repose angle (ϕ) and a collapse angle (θ).

Meanwhile, in the first granular epoxy resin composition for encapsulating a semiconductor, the collapse angle is preferably not more than 35 degrees, more preferably not more than 30 degrees, and further preferably not more than 25 degrees in view of conveyance performance by use of a conveyance means such as a vibration feeder or the like. In case that the angle is within the above numerical range, adhesion, clogging or the like hardly occurs and the granular resin composition can be stably conveyed in case that it is conveyed using a conveyance means such as a vibration feeder or the like. In addition, as the collapse angle is smaller, adhesion, clogging or the like hardly occurs. Thus, the lower limit is not particularly limited, but it can be, for example, not less than 1 degree or not less than 10 degrees. As a method of measuring the collapse angle, a granular resin composition 202 as shown in FIG. 5 is allowed to fall downward and is deposited on a horizontal plate 205 in a predetermined area from a hole of a funnel 201 until it becomes a predetermined shape, whereby a conical granule 204 is formed. Subsequently, a balance weight 203 having a certain weight placed on a pedestal 206 along with the horizontal plate 205 is allowed to fall downward to apply a certain impact to the granule 204, and a part of the granular resin composition is allowed to naturally flow for falling out from the horizontal plate 205, and then the collapse angle of a remained conical granule 207 can be determined as an elevation angle from a point on the outer periphery of the bottom surface to the top of the cone. Further, in the granule 204 before applying an impact thereon, the elevation angle is called a repose angle, while the difference between the repose angle and the collapse angle is called the angle of difference. The angle of difference indicates an index representing an easiness of collapsing of the granular resin composition due to vibration from a conveying device such as a vibration feeder or the like. As the angle of difference is greater, the granular resin composition is easily collapsed. So, it is preferably, for example, not less than 10 degrees and more preferably not less than 15 degrees. As a measuring apparatus of the collapse angle and the repose angle, a powder tester (a product of Hosokawa Micron Group) may be used.

In the first granular epoxy resin composition for encapsulating a semiconductor, in order to have the particle size distribution, the ratio of particles having the longest length (L) of not more than 5 mm and the shortest length (S) of not more than 1 mm, and the collapse angle in the aforementioned ranges, a method for obtaining the granular epoxy resin composition for encapsulating a semiconductor to be described below is used, or the kind and the mixing ratio of an epoxy resin, a curing agent and a curing accelerator are adjusted.

The operational effect of the first granular epoxy resin composition for encapsulating a semiconductor will be described with reference to the objects inherent to the compression molding method.

Figure 2:
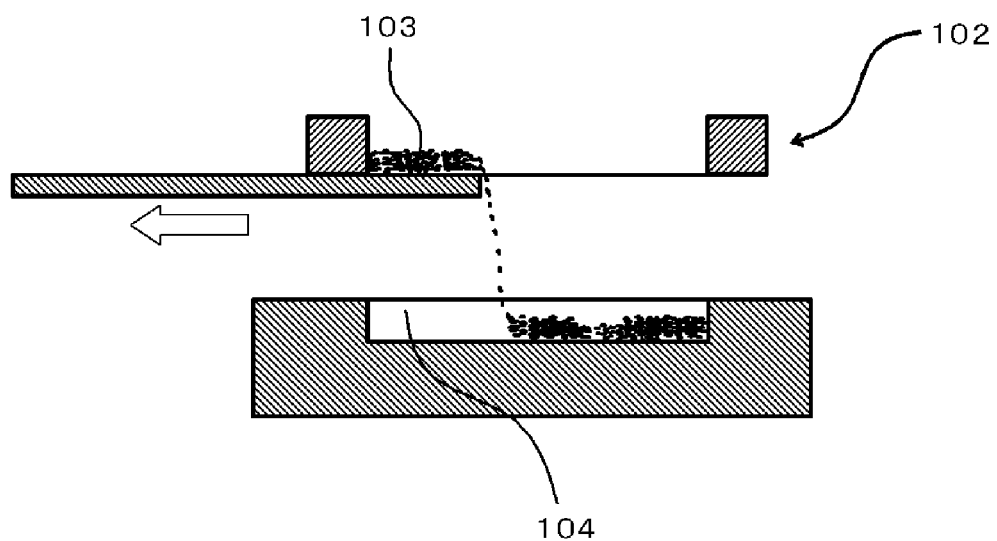
FIG. 2 is a schematic diagram of one example of a method of supplying a granular resin composition into a lower cavity of a mold in a method for obtaining a semiconductor device obtained by encapsulating a semiconductor element by compression molding using the granular resin composition.

As shown in FIGS. 1 and 2 above, in the case of the compression molding method including encapsulating a semiconductor element using the granular resin composition, it is necessary to uniformly sprinkle the granular resin composition on the bottom surface of the lower cavity of the compression mold. However, in addition to the above examples, when the method includes a step of conveying the granular resin composition using a conveyance means such as a vibration feeder or the like, particles of the granular resin composition are adhered to one another on the conveyance path of a conveyance means such as a vibration feeder or the like, or the granular resin composition is attached to the conveyance path in some cases. Also, the granular resin composition is clogged (hopper bridge) at a supply port to the conveyance path or the granular resin composition stays on the conveyance path in some cases. When supply of the granular resin composition is varied by use of a conveyance means such as a vibration feeder or the like due to such adhesion, attachment, clogging, stagnation or the like, uneven sprinkling occurs to the bottom surface of the lower cavity of the compression mold. When there are a place with a small amount of the granular resin composition and a place with a large quantity thereof depending on the place of the bottom surface of the lower cavity due to occurrence of such uneven sprinkling, flow in the lateral direction takes place from the place with a large quantity of the granular resin composition to the place with a small amount thereof during encapsulation molding of a semiconductor element. Thus, there has been a possibility of causing wire sweep of a semiconductor element, or causing defective filling such as nests, voids or the like in the place with a small amount of the granular resin composition. Furthermore, in case that the granular resin composition has a certain degree of the particle size distribution, depending on its particle shape (for example, a sphere), a variation in the melting speed among particles easily occurs, and a problem of defective filling such as nests, voids or the like occurs in some cases. In particular, in the case of a semiconductor device in which a thickness of an encapsulation material on a semiconductor element is thin, an effect of uneven sprinkling on the lower cavity of the compression mold becomes remarkable, thus easily causing a problem such as wire sweep, unsatisfactory filling or the like because the amount of the resin composition in use becomes small. When adhesion, attachment, clogging, stagnation or the like occurs, the conveyance time takes a long time, and the productivity may also be lowered.

On the other hand, the first granular epoxy resin composition for encapsulating a semiconductor is an epoxy resin composition for encapsulating a semiconductor used for a semiconductor device obtained by encapsulating a semiconductor element by compression molding, and is characterized in that in the particle size distribution as determined by sieving the whole epoxy resin composition for encapsulating a semiconductor using JIS standard sieves, the ratio of particles having a size of 2 mm or greater is not more than 3% by mass, the ratio of particles having a size of 1 mm or greater, but less than 2 mm is from 5% by mass to 60% by mass, and the ratio of microfine particles having a size of less than 106 µm is not more than 0.5% by mass. Thus, adhesion of the granular resin composition is prevented and uneven sprinkling is reduced, so that conveyance performance and productivity can be improved. Furthermore, the method for producing a semiconductor device of the present invention includes encapsulating a semiconductor element by compression molding using the aforementioned granular epoxy resin composition for encapsulating a semiconductor. Thus, a semiconductor device can be produced without causing failures such as defective filling and wire sweep.

Meanwhile, the semiconductor device is a semiconductor device equipped with a lead frame or a circuit board, one or more semiconductor elements laminated or mounted in parallel on the lead frame or the circuit board, bonding wires for electrically connecting the lead frame or the circuit board and the semiconductor elements, and an encapsulation material for encapsulating the semiconductor elements and the bonding wires, and the encapsulation material is composed of a cured product of the granular epoxy resin composition for encapsulating a semiconductor of the present invention by compression molding. With respect to the problem of uneven sprinkling onto the mold cavity due to a supply variation, failures such as defective filling, deterioration of wire sweep and the like can be effectively reduced in case that a thickness of the encapsulation material on the semiconductor element is from 0.08 mm or more to 0.5 mm or less, and such failures can be particularly effectively reduced in case that a thickness of the encapsulation material on the semiconductor element is from 0.1 mm or more to 0.3 mm or less. As the thickness of the encapsulation material on the semiconductor element is thinner, the amount of the resin composition in use becomes extremely smaller. So, the granular resin composition is too sparsely present in the mold cavity, and the possibility of causing unfilling or the like becomes high. As the thickness of the encapsulation material on the semiconductor element is thicker, the amount of the resin composition in use is higher. So, an effect even by a variation in the supply is small. Herein, the thickness of the encapsulation material on the semiconductor element refers to a thickness of an encapsulation material covering a surface opposite to a surface on which a lead frame or a circuit board of the semiconductor element is mounted. In case that one or more semiconductor elements are laminated and mounted on a lead frame or a circuit board, it refers to a thickness of an encapsulation material covering a surface of the semiconductor element on the top opposite to a surface on which the lead frame or the circuit board is mounted.

As described above, according to the present invention, in case that a semiconductor device is obtained by encapsulating a semiconductor element by compression molding using the first granular epoxy resin composition for encapsulating a semiconductor, it is possible to obtain a granular epoxy resin composition for encapsulating a semiconductor in which adhesion of the granular resin composition is prevented, uneven sprinkling is reduced, conveyance performance is improved, and the productivity is further improved. Furthermore, a semiconductor device excellent in the reliability can be produced without causing failures such as defective filling and wire sweep by encapsulating a semiconductor element by compression molding using the granular epoxy resin composition for encapsulating a semiconductor.

Meanwhile, the first granular epoxy resin composition for encapsulating a semiconductor can be suitably used for a semiconductor device in which a lead frame or a circuit board and a semiconductor element are connected by means of fine pitch wires, long wires, small diameter wires or the like, particularly a semiconductor device in which a thickness of an encapsulation material on a semiconductor element is not more than 0.5 mm.

The constructions Y1 and Y2 of the second granular epoxy resin composition for encapsulating a semiconductor will be described below.

Constructions Y1 and Y2

For the second granular epoxy resin composition for encapsulating a semiconductor, the lower limit of the ratio (D1/D2) of the granule density D1 to the specific gravity D2 of a cured product after curing is preferably not less than 0.88, more preferably not less than 0.88 and further preferably not less than 0.90. The upper limit of D1/D2 is preferably not more than 0.97, more preferably not more than 0.95 and further preferably not more than 0.94. In case that the ratio is not less than the above lower limit, there is no possibility of excessively increasing the porosity inside the particles, and there is little risk of causing a problem of formation of voids during molding or the like. Also, in case that the ratio is not more than the above upper limit, there is no possibility of excessively increasing the granule density, and the movement speed of granules may not become slower during conveyance by use of a conveyance means such as a vibration feeder or the like either. In case that the movement speed becomes slower, there is the risk of stagnation, and accordingly a problem such as adhesion, clogging or the like might occur. Furthermore, the granule density D1 of the granular resin composition is preferably not more than 1.95 and more preferably not more than 1.90. In case that the ratio is not more than the above upper limit, excellent conveyance performance is achieved. Furthermore, the lower limit of the granule density D1 of the granular resin composition is not particularly limited, but it is preferably not less than 1.75 belonging to a range in which the porosity inside the particles is not excessively increased.

As a method of measuring the granule density D1, the granular resin composition is sieved using JIS standard sieves of 32 meshes (aperture: 500 μm) so as to easily handle it, and then about 5 g of the granular resin composition on the sieves was weighed up to 0.1 mg to give a sample. A pycnometer (capacity: 50 cc) is filled with distilled water, several drops of a surface active agent are further added thereto, and then the mass of the pycnometer containing distilled water and the surface active agent is measured. Subsequently, the sample is put into the pycnometer and the total mass of the pycnometer containing distilled water, the surface active agent and the sample is measured to calculate the granule density according to the following equation.

$$\text{Granule density (g/ml)} = (Mp \times \rho w)/(Mw + Mp - Mt)$$

$\rho w$: Density (g/ml) of distilled water at a temperature during measurement

Mw: Mass (g) of pycnometer which is filled with distilled water and further several drops of a surface active agent are added thereto Mp: Mass (g) of sample Mt: Mass (g) of pycnometer containing distilled water, surface active agent and sample Herein, a surface active agent is used to increase the wettability of distilled water and the sample, and to make an entrainment of foam to a minimum. The surface active agent which can be used is not particularly limited, and materials without causing an entrainment of foam may be selected.

The second granular epoxy resin composition for encapsulating a semiconductor is used for a semiconductor device obtained by encapsulating a semiconductor element by compression molding. However, from the fact that the value is not changed depending on the molding method, as a method of measuring the specific gravity D2 of a cured product according to the present invention, there is used a method of measuring the specific gravity of a cured product by transfer molding that is a simpler method. Specifically, there may be cited a method comprising once forming the granular resin composition into a tablet having a predetermined size, forming a disk having a diameter of 50 mm and a thickness of 3 mm at a mold temperature of 175±5° C. and an injection pressure of 7 MPa for a curing time of 120 seconds using a transfer molding machine, and calculating the specific gravity of a cured product of a molding material by determining the mass and volume.

In the second granular epoxy resin composition for encapsulating a semiconductor, in order to have the particle size distribution, the ratio (D1/D2) of the granule density D1 to the specific gravity D2 of a cured product after curing and the granule density D1 in the aforementioned ranges, a method for obtaining the granular epoxy resin composition for encapsulating a semiconductor to be described below is used, or the kind and the mixing ratio of an epoxy resin, a curing agent and a curing accelerator are adjusted.

The operational effect of the second granular epoxy resin composition for encapsulating a semiconductor will be described with reference to the objects inherent to the compression molding method.

In addition to FIGS. 1 and 2 above, in the case of the compression molding method comprising encapsulating a semiconductor element using the granular resin composition, it is necessary that the granular resin composition is always stably supplied in a specific amount. When the disorder occurs during conveyance of the granular resin composition in the conveyance path, or when adhesion among particles of the granular resin composition or attachment of the granular resin composition to the conveyance path occurs, there are problems such that clogging, delay in the supply time or irregular supply to the mold occurs, the productivity is greatly lowered, and unsatisfactory filling occurs.

On the other hand, the second granular epoxy resin composition for encapsulating a semiconductor is an epoxy resin composition for encapsulating a semiconductor used for a semiconductor device obtained by encapsulating a semiconductor element by compression molding, and is characterized in that in the particle size distribution as determined by sieving the whole epoxy resin composition for encapsulating a semiconductor using JIS standard sieves, the ratio of coarse particles having a size of 2 mm or greater is not more than 3% by mass, the ratio of microfine particles having a size of less than 106 μm is not more than 5% by mass, and the ratio (D1/D2) of the granule density D1 of the epoxy resin composition for encapsulating a semiconductor to the specific gravity D2 of a cured product after curing the epoxy resin composition for encapsulating a semiconductor is in the range of 0.88 or more to 0.97 or less. Accordingly, adhesion of the granular resin composition is prevented, so that conveyance performance and productivity can be improved. Furthermore, the method for producing a semiconductor device of the present invention comprises encapsulating a semiconductor element by compression molding using the aforementioned granular epoxy resin composition for encapsulating a semiconductor, and accordingly a semiconductor device can be produced without causing failures such as defective filling and the like.

As described above, according to the present invention, in case that a semiconductor device is obtained by encapsulating a semiconductor element by compression molding using the second granular epoxy resin composition for encapsulating a semiconductor, it is possible to obtain a granular epoxy resin composition for encapsulating a semiconductor in which adhesion of the granular resin composition can be prevented, conveyance performance is improved, and the production can be further improved. Furthermore, a semiconductor device excellent in the reliability can be produced without causing failures such as defective filling and the like by encapsulating a semiconductor element by compression molding using the granular epoxy resin composition for encapsulating a semiconductor.

Meanwhile, the second granular epoxy resin composition for encapsulating a semiconductor can be suitably used for a semiconductor device in which a lead frame or a circuit board and a semiconductor element are connected by means of fine pitch wires, long wires, small diameter wires or the like.

The first granular epoxy resin composition for encapsulating a semiconductor has the construction X1, X2 or X3. Besides, the first granular epoxy resin composition for encapsulating a semiconductor may have the construction Y1 or Y2 of the second granular epoxy resin composition for encapsulating a semiconductor.

On the other hand, the second granular epoxy resin composition for encapsulating a semiconductor has the construction Y1 or Y2. Incidentally, the second granular epoxy resin composition for encapsulating a semiconductor may have the construction X1, X2 or X3 of the first granular epoxy resin composition for encapsulating a semiconductor.

Components of Granular Resin Composition According to the Present Invention

Hereinafter, in the present invention, the components of the granular epoxy resin composition for encapsulating a semiconductor used for a semiconductor device obtained by encapsulating a semiconductor element by compression molding will be described. In the granular epoxy resin composition for encapsulating a semiconductor of the present invention, an epoxy resin may be used. The epoxy resin in use may generally be monomers, oligomers, and polymers having two or more epoxy groups in one molecule. The molecular weight and molecular structure thereof are not particularly limited, and examples thereof include crystalline epoxy resins such as a biphenyl type epoxy resin, a bisphenol A type epoxy resin, a bisphenol F type epoxy resin, a stilbene type epoxy resin, a hydroquinone type epoxy resin and the like; novolac type epoxy resins such as a cresol novolac type epoxy resin, a phenol novolac type epoxy resin, a naphthol novolac type epoxy resin and the like; phenol aralkyl type epoxy resins such as a phenol aralkyl type epoxy resin having a phenylene structure, a phenol aralkyl type epoxy resin having a biphenylene structure, a naphthol aralkyl type epoxy resin having a phenylene structure and the like; trifunctional epoxy resins such as a triphenolmethane type phenol resin, an alkyl-modified triphenolmethane type phenol resin and the like; modified phenol type epoxy resins such as a dicyclopentadiene-modified phenol type epoxy resin, a terpene-modified phenol type epoxy resin and the like; and heterocyclic ring-containing epoxy resins such as a triazine nucleus-containing epoxy resin and the like. These may be used alone or in combination of two or more kinds.

In the granular epoxy resin composition for encapsulating a semiconductor of the present invention, a curing agent may be used. The curing agent in use is not particularly limited as long as it functions to cure the resin composition by reacting with an epoxy resin, and examples thereof include straight chain aliphatic diamines having 2 to 20 carbon atoms such as ethylenediamine, trimethylenediamine, tetramethylenediamine, hexamethylenediamine and the like; amines such as m-phenylenediamine, p-phenylenediamine, p-xylenediamine, 4,4'-diaminodiphenylmethane, 4,4'-diaminodiphenylpropane, 4,4'-diaminodiphenyl ether, 4,4'-diaminodiphenyl sulfone, 4,4'-diaminodicyclohexane, bis(4-aminophenyl)phenylmethane, 1,5-diaminonaphthalene, m-xylyenediamine, p-xylenediamine, 1,1-bis(4-aminophenyl)cyclohexane, dicyanodiamide and the like; resol type phenolic resins such as an aniline-modified resol resin, a dimethyl ether resol resin and the like; novolac type phenolic resins such as a phenolic novolac resin, a cresol novolac resin, a tert-butylphenolic novolac resin, a nonylphenolic novolac resin and the like; phenol aralkyl resins such as a phenol aralkyl resin having a phenylene structure, a phenol aralkyl resin having a biphenylene structure and the like; phenolic resins each having a condensed polycyclic structure such as a naphthalene structure or an anthracene structure; polyoxystyrenes such as poly-p-oxystyrene and the like; acid anhydrides containing alicyclic anhydrides such as hexahydrophthalic anhydride (HHPA), methyl tetrahydrophthalic anhydride (MTHPA) and the like, aromatic acid anhydrides such as trimellitic anhydride (TMA), pyromellitic anhydride (PMDA), benzophenonetetracarboxylic acid (BTDA) and the like; polymercaptan compounds such as polysulfide, thioester, thioether and the like; isocyanate compounds such as isocyanate prepolymer, blocked isocyanate and the like; and organic acids such as a carboxylic acid-containing polyester resin and the like. These may be used alone or in combination of two or more kinds. Among these, as a curing agent used for a semiconductor encapsulation material, preferably used is a compound having at least two or more phenolic hydroxyl groups in one molecule in view of moisture resistance, reliability and the like. Examples include novolac type phenolic resins such as a phenolic novolac resin, a cresol novolac resin, a tert-butylphenolic novolac resin, resol phenolic resins such as a nonylphenolic novolac resin and the like; polyoxystyrenes such as poly-p-oxystyrene and the like; and a phenol aralkyl resin having a phenylene structure, a phenol aralkyl resin having a biphenylene structure and the like.

In the granular epoxy resin composition for encapsulating a semiconductor of the present invention, an inorganic filling material may be used. The inorganic filling material in use is not particularly limited as long as it is generally used for a semiconductor encapsulation material, and examples include silica such as molten crushed silica, molten spherical silica, crystal silica, secondary aggregated silica and the like; alumina; titanium white; aluminum hydroxide; talc; clay; mica; glass fiber and the like. Among these, particularly preferably used is molten spherical silica. The particle shape is preferably infinitely nearly spherical. Furthermore, the amount of an inorganic filling material may be increased by mixing particles having different sizes. However, the particle diameter is preferably from 0.01 μm or more to 150 μm or less in consideration of filling properties onto the periphery of the semiconductor element in the mold cavity.

In the granular epoxy resin composition for encapsulating a semiconductor of the present invention, a curing accelerator may be used. The curing accelerator in use may be good as long as it accelerates a curing reaction of an epoxy group with a curing agent, and those used for a semiconductor encapsulation material in general can be used. Examples thereof include diazabicycloalkene and derivatives thereof such as 1,8-diazabicyclo(5,4,0)undecene-7 and the like; amine compounds such as tributylamine, benzyldimethylamine and the like; imidazole compounds such as 2-methylimidazole and the like; organic phosphines such as triphenyl phosphine, methyldiphenyl phosphine and the like; tetra-substituted phosphonium tetra-substituted borate such as tetraphenyl phosphonium tetraphenyl borate, tetraphenyl phosphonium tetra benzoic acid borate, tetraphenyl phosphonium tetra naphthoic acid borate, tetraphenyl phosphonium tetra naphthoyl oxy borate, tetraphenyl phosphonium tetra naphthyl oxy borate and the like; and triphenyl phosphine with benzoquinone added thereto. These may be used alone or in combination of two or more kinds. More preferable examples include curing accelerators having latency in which a sudden increase in the viscosity after melting the granular resin composition in the mold cavity is reduced.

The granular epoxy resin composition for encapsulating a semiconductor of the present invention, in addition to the aforementioned components, may contain, as necessary, various additives such as coupling agents such as γ-glycidoxypropyltrimethoxysilane and the like; coloring agents such as carbon black and the like; release agents such as natural wax, synthesized wax, a higher fatty acid or a metal salt thereof, paraffin, oxidized polyethylene wax and the like; low stress agents such as silicone oil, silicone rubber and the like; ion trapping agents such as hydrotalcite and the like; flame retardants such as aluminum hydroxide and the like; and antioxidants.

Method for Producing Granular Resin Composition According to the Present Invention Next, the method for obtaining a granular epoxy resin composition for encapsulating a semiconductor of the present invention will be described. The method for obtaining a granular resin composition is not particularly limited as long as it satisfies the particle size distribution and the granule density of the present invention, and examples include a method including supplying a melt-kneaded resin composition to the inside of the rotor composed of a cylindrical outer peripheral portion having a plurality of small pores and a disk-shaped bottom surface, and allowing the resin composition to pass through small pores by centrifugal force obtained by the rotation of the rotor (hereinafter referred to as the centrifugal powdering method); a method including premixing respective raw material components using a mixer, and then kneading with heating by use of a kneading machine such as a roller, a kneader, an extruder or the like, followed by cooling and pulverizing to give a pulverized product, and removing coarse particles and microfine particles using sieves (hereinafter referred to as the pulverizing-sieving method); a method including premixing respective raw material components using a mixer, and then kneading with heating using an extruder having a die with a plurality of small pores at the front end of the screw and cutting a molten resin extruded from small pores arranged at the die into a strand form using a cutter slidingly rotating almost in parallel to the die surface (hereinafter referred to as the hot cutting method), and the like. The particle size distribution and the granule density of the present invention can be obtained by selecting kneading conditions, centrifugal conditions, sieving conditions, cutting conditions or the like in all of the methods. A particularly preferably used is a centrifugal powdering method. The granular resin composition obtained by the method can stably exhibit the particle size distribution and the granule density of the present invention, so that the method is preferable for conveyance performance and the prevention of adhesion on the conveyance path. Furthermore, in the centrifugal powdering method, since it is possible to make the surface of particles smooth to some extent, the method is preferable in terms of prevention of bridging (clogging) in the supply port to the conveyance path and prevention of stagnation on the conveyance path without sticking particles among themselves or without increasing the frictional resistance with the conveyance path surface. Furthermore, in the centrifugal powdering method, voids inside the particles are formed to some extent because the resin composition is formed using centrifugal force from the molten state, and the method is favorable to conveyance performance in compression molding because the granule density may be reduced to some extent.

On the other hand, in the pulverizing-sieving method, a method of treating a large quantity of microfine particles and coarse particles generated by sieving needs to be reviewed, but a sieving apparatus or the like is used at the existing production line of the resin composition, so that the conventional production line can be used without any modification; therefore the method is preferable. Furthermore, the pulverizing-sieving method includes many factors which can be independently controlled in order to exhibit the particle size distribution of the present invention, for example, selection of a sheet thickness in forming a molten resin into a sheet before pulverization, selection of pulverizing conditions during pulverization or a screen, selection of a sieve during sieving and the like, so that there are plenty of choices for adjusting the particle size distribution as desired; therefore, the method is preferable. Furthermore, the hot cutting method is also preferable because the conventional production line can be used without any modification but just by adding, for example, a hot cutting mechanism to a front end of the extruder.

Figure 6:
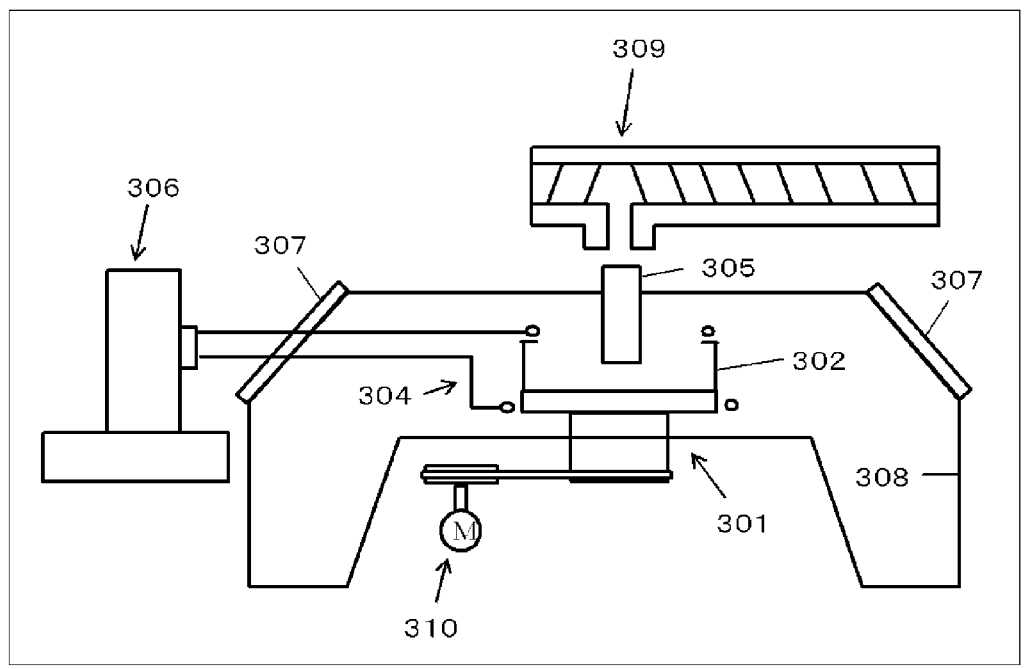
FIG. 6 is a schematic diagram of one example from melt kneading of a resin composition to collection of a granular resin composition in order to obtain the granular epoxy resin composition for encapsulating a semiconductor of the present invention.
Figure 7:
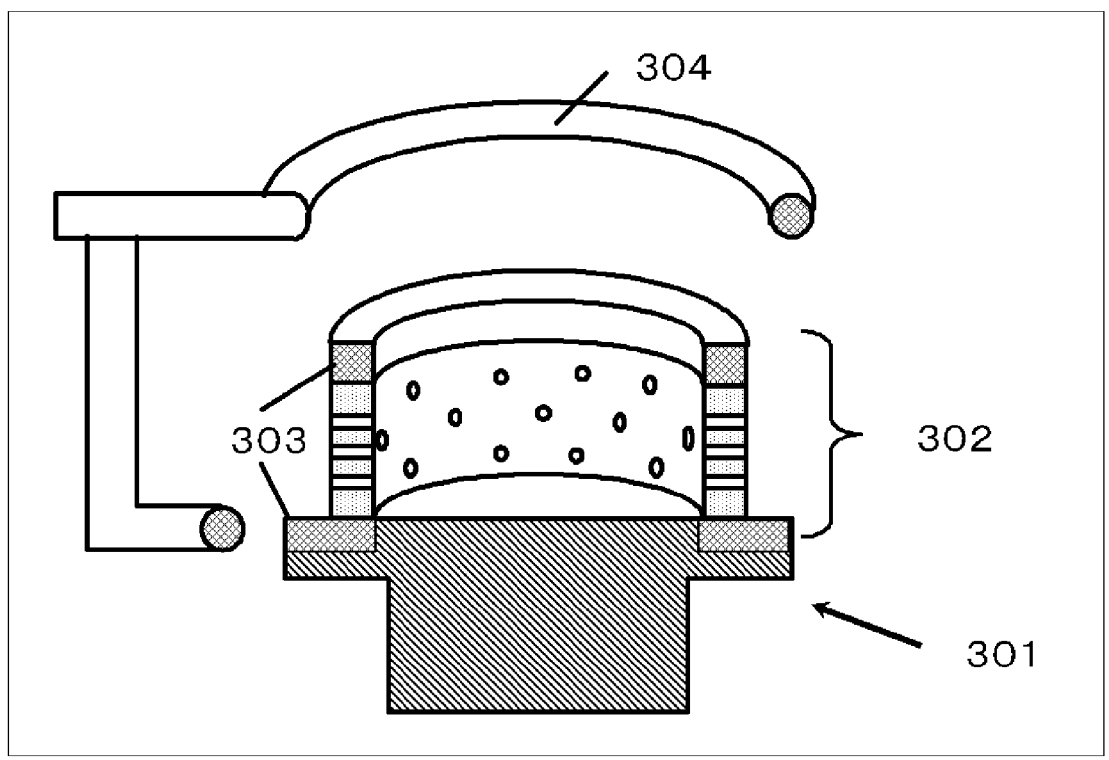
FIG. 7 is a cross-sectional view of one example of an exciting coil in order to heat a rotor used in the present invention and a cylindrical outer peripheral portion of the rotor.
Figure 8:
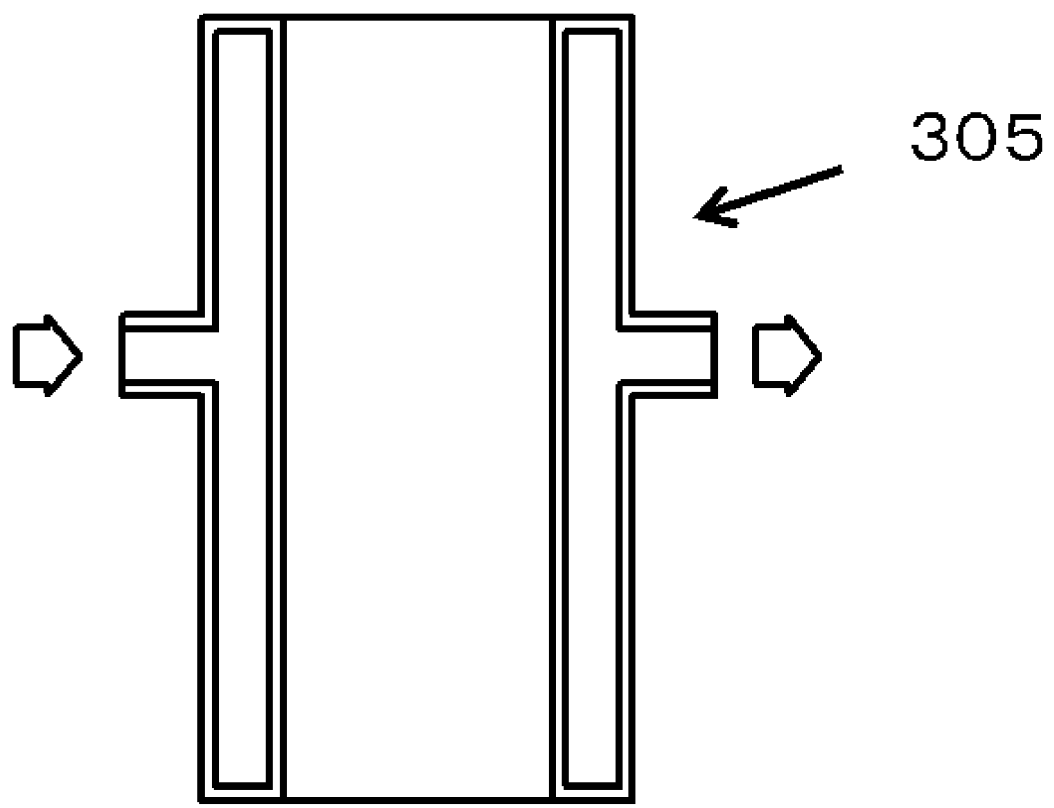
FIG. 8 is a cross-sectional view of one example of a double tube cylindrical body for supplying the melt-kneaded resin composition to the rotor.

Next, the centrifugal powdering method, one example of a production method for obtaining the granular epoxy resin composition for encapsulating a semiconductor of the present invention, will be described in more detail with reference to the drawings. FIG. 6 illustrates a schematic diagram of one example from melt kneading of a resin composition until collection of a granular resin composition in order to obtain a granular resin composition for encapsulating a semiconductor. FIG. 7 illustrates a cross-sectional view of one example of an exciting coil for heating a rotor and a cylindrical outer peripheral portion of the rotor. FIG. 8 illustrates a cross-sectional view of one example of a double tube cylindrical body for supplying the melt-kneaded resin composition to the rotor.

The resin composition melt-kneaded at a twin screw extruder 309 is supplied to the inside of a rotor 301 through a double tube cylindrical body 305 cooled by a coolant between an inner wall and an outer wall. At this time, it is preferable that the double tube cylindrical body 305 is cooled using a coolant such that the melt-kneaded resin composition is not attached to a wall of the double tube cylindrical body 305. The resin composition is supplied to the rotor 301 through the double tube cylindrical body 305. So, even when the resin composition is continuously supplied in a filamentous shape, the resin composition can be stably supplied without overflowing from the rotor 301 by the rotation of the rotor 301 at a high speed. Furthermore, the particle shape and the particle size distribution of the granular resin composition can be adjusted by controlling a discharge temperature of the melted resin or the like according to the kneading conditions in the twin screw extruder 309. Furthermore, an entrainment of foam into particles can be controlled by installing a degasifier at the twin screw extruder 309.

The rotor 301 is connected to a motor 310 and can be rotated at an arbitrary number of rotations, so that the particle shape and the particle size distribution of the granular resin composition can be adjusted by properly selecting the number of rotations. A cylindrical outer peripheral portion 302 having a plurality of small pores arranged on the periphery of the rotor 301 is provided with a magnetic material 303, and is heated by the eddy current loss or the hysteresis loss accompanied by passing of an alternating magnetic flux generated by electrically connecting an AC power supply generated by means of an AC power supply generating device 306 to an exciting coil 304 arranged in the vicinity. Examples of the magnetic material 303 include an iron material, silicon steel and the like. One or two or more of the magnetic materials 303 may be used in combination. The vicinity of small pores of the cylindrical outer peripheral portion 302 having a plurality of small pores may not be formed of the same material as the magnetic material 303, and may be formed, for example, of a nonmagnetic material having a high thermal conductivity. So, the vicinity of small pores of the cylindrical outer peripheral portion 302 can be heated by heat conduction from the heated magnetic material 303 as a heat source by having the magnetic material 303 at its upper and lower portions. Examples of the nonmagnetic material include copper, aluminum and the like, and one or two or more of nonmagnetic materials may be used in combination. The resin composition is supplied to the inside of the rotor 301, and then flies to the heated cylindrical outer peripheral portion 302 by centrifugal force obtained by the rotation of the rotor 301 with the motor 310.

The resin composition brought into contact with the heated cylindrical outer peripheral portion 302 having a plurality of small pores easily passes through small pores of the cylindrical outer peripheral portion 302 and discharged without causing an increase of the melt viscosity. The heating temperature may be arbitrarily set depending on the properties of the resin composition in use. By properly selecting the heating temperature, the particle shape and the particle size distribution of the granular resin composition can be adjusted. In general, when the heating temperature is excessively increased, curing of the resin composition proceeds so that the flowability is reduced or small pores of the cylindrical outer peripheral portion 302 are clogged in some cases. However, in the case of the proper temperature condition, the contact time of the resin composition with the cylindrical outer peripheral portion 302 is extremely short, so that an effect on the flowability is extremely small. The cylindrical outer peripheral portion 302 having a plurality of small pores is evenly heated, so that partial change in the flowability is extremely small. Also, the particle shape and the particle size distribution of the granular resin composition can be adjusted by properly selecting a pore size of a plurality of small pores of the cylindrical outer peripheral portion 302.

The granular resin composition discharged through small pores of the cylindrical outer peripheral portion 302 is collected, for example, at an outer tank 308 installed in the periphery of the rotor 301. It is preferable that the outer tank 308 is installed such that a collision surface against which the granular resin composition passing through small pores of the cylindrical outer peripheral portion 302 and flying collides has a slop of from 10 to 80 degrees and preferably 25 to 65 degrees to the flying direction of the granular resin composition, in order to prevent attachment of the granular resin composition onto the inner wall, fusion among the granular resin compositions. When the slope of the collision surface to the flying direction of the resin composition is not more than the above upper limit, the collision energy of the granular resin composition can be fully dispersed, so that there is little risk of causing attachment onto the wall surface. On the other hand, when the slope of the collision surface to the flying direction of the resin composition is not less than the above lower limit, the flying speed of the granular resin composition can be fully reduced so that, even in the case of secondary collision against the wall surface of the outer tank, there is little risk of causing attachment onto its exterior wall surface.

Meanwhile, when the temperature at the collision surface against which the granular resin composition collides becomes high, the granular resin composition is easily attached, so that it is preferable that a cooling jacket 307 is arranged in the periphery of the collision surface for cooling the collision surface. The inner diameter of the outer tank 308 preferably has such a size that the granular resin composition is fully cooled, thus preventing attachment of the granular resin composition onto the inner wall and fusion among the granular resin compositions. In general, air flows by the rotation of the rotor 301, so that a cooling effect is obtained. However, cold wind may be introduced, as necessary. The size of the outer tank 308 is varied depending on the amount of the resin to be treated, but, for example, in case that the diameter of the rotor 301 is 20 cm, attachment and fusion can be prevented as long as the inner diameter of the outer tank 308 is about 100 cm.

Semiconductor Device According to the Present Invention

Then, the semiconductor device of the present invention obtained by encapsulating a semiconductor element by compression molding using the granular epoxy resin composition for encapsulating a semiconductor will be illustrated. Incidentally, the method for obtaining a semiconductor device obtained by encapsulating a semiconductor element by compression molding using the granular resin composition of the present invention is the same as mentioned above. The semiconductor element encapsulated in the semiconductor device of the present invention is not particularly limited, and examples include integrated circuits, large scale integrated circuits, transistors, thyristors, diodes, solid-state image sensing devices and the like.

The shape of the semiconductor device of the present invention is not particularly limited, and examples include ball grid arrays (BGAs), MAP type BGAs and the like. It can also be applied to chip size packages (CSPs), quad flat no leaded packages (QFNs), small outline no leaded packages (SONs), lead frame BGAs (LF-BGAs) and the like.

The semiconductor device of the present invention obtained by encapsulating a semiconductor element from a cured product of the resin composition by compression molding is used as it is or is mounted on any electronic apparatus after completely curing the resin composition at a temperature of about 80° C. to 200° C. over a period of about 10 minutes to 10 hours.

Hereinafter, the semiconductor device including a lead frame or a circuit board, one or more semiconductor elements laminated or mounted in parallel on the lead frame or the circuit board, bonding wires for electrically connecting the lead frame or the circuit board and the semiconductor elements, and an encapsulation material for encapsulating the semiconductor elements and the bonding wires will be described in detail with reference to the drawings. However, the present invention is not restricted to the semiconductor devices using bonding wires.

Figure 9:
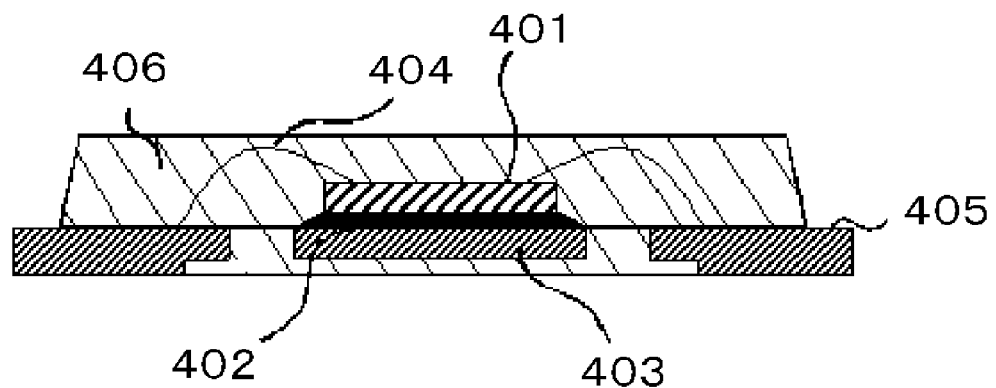
FIG. 9 is a view showing a cross-sectional structure of one example of a semiconductor device obtained by encapsulating a semiconductor element mounted on a lead frame using the epoxy resin composition for encapsulating a semiconductor according to the present invention.

FIG. 9 is a view showing a cross-sectional structure of one example of a semiconductor device obtained by encapsulating a semiconductor element mounted on a lead frame using the epoxy resin composition for encapsulating a semiconductor of the present invention. A semiconductor element 401 is fixed through a die bond material cured product 402 on a die pad 403. An electrode pad of the semiconductor element 401 and a lead frame 405 are connected by means of a wire 404. The semiconductor element 401 is encapsulated with an encapsulation material 406 composed of a cured product of the epoxy resin composition for encapsulating a semiconductor.

Figure 10:
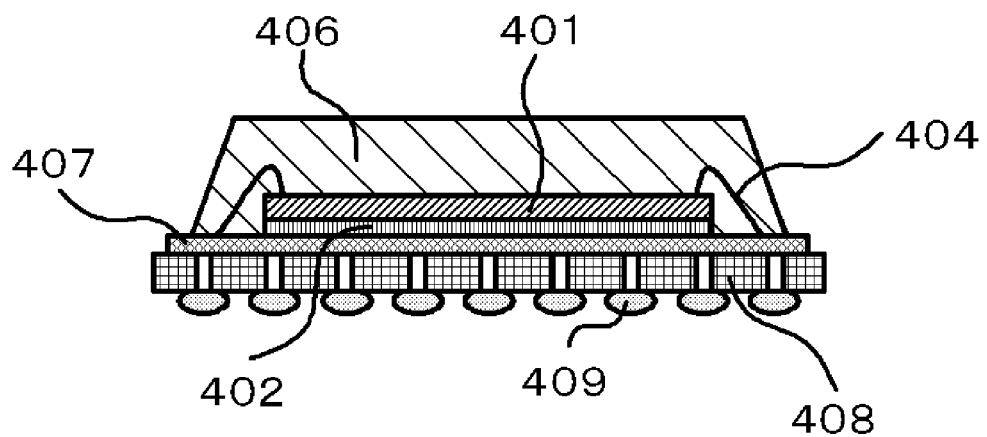
FIG. 10 is a view showing a cross-sectional structure of one example of a semiconductor device obtained by encapsulating a semiconductor element mounted on a circuit board using the epoxy resin composition for encapsulating a semiconductor according to the present invention.

FIG. 10 is a view showing a cross-sectional structure of one example of a semiconductor device obtained by encapsulating a semiconductor element mounted on a circuit board using the epoxy resin composition for encapsulating a semiconductor according to the present invention. A semiconductor element 401 is fixed through a die bond material cured product 402 on a circuit board 408. An electrode pad 407 on the semiconductor element 401 and an electrode pad 407 on the circuit board 408 are connected by means of a wire 404. Only one side on which the semiconductor element 401 in the circuit board 408 is mounted is encapsulated with an encapsulation material 406 composed of a cured product of the epoxy resin composition for encapsulating a semiconductor. The electrode pad 407 on the circuit board 408 is connected with solder balls 409 on a non-encapsulated side on the circuit board 408 thereinside.

EXAMPLES

The present invention is now illustrated in more detail below with reference to Examples. However, the present invention is not restricted to these Examples.

First Granular Epoxy Resin Composition for Encapsulating Semiconductor

Example 1-1

Mixing of Resin Composition (Part by Mass)

Epoxy resin 1: 8.0 parts by mass of a phenol aralkyl type epoxy resin having a phenylene structure (NC3000, manufactured by Nippon Kayaku Co., Ltd., softening point: 58° C., epoxy equivalent: 277)

Epoxy resin 2: 2.0 parts by mass of a bisphenol A type epoxy resin (YL6810, manufactured by Japan Epoxy Resin Co., Ltd., melting point: 45° C., epoxy equivalent: 172)

Phenolic resin 1: 2.6 parts by mass of a phenol aralkyl resin having a phenylene structure (XLC-4L, manufactured by Mitsui Chemicals, Inc., softening point: 65° C., hydroxyl equivalent: 165)

Phenolic resin 2: 2.6 parts by mass of a phenolic novolac resin (PR-HF-3, manufactured by Sumitomo Bakelite Co., Ltd., softening point: 80° C., hydroxyl equivalent: 105)

Curing accelerator (triphenylphosphine) 0.2 parts by mass

Inorganic filling material (molten spherical silica having an average particle diameter of 16 µm)

84.0 parts by mass

Carnauba wax 0.1 part by mass

Carbon black 0.3 parts by mass

Coupling agent 0.2 parts by mass

Preparation of Masterbatch

The above mixed resin composition raw materials were pulverized and mixed by use of a super mixer for 5 minutes, and the mixed raw materials were prepared.

Production of Granular Resin Composition

A punched metallic mesh made of iron having small pores of a pore diameter of 2.5 mm was used as a material of the cylindrical outer peripheral portion 302 illustrated in FIG. 6. A punched metallic mesh having a height of 25 mm and a thickness of 1.5 mm processed into a cylindrical shape was installed on the periphery of the rotor 301 having a diameter of 20 cm, whereby the cylindrical outer peripheral portion 302 was formed. The cylindrical outer peripheral portion 302 was heated with the exciting coil at 115° C. by the rotation of the rotor 301 at a speed of 3,000 rpm. The number of rotations of the rotor 301 and the temperature of the cylindrical outer peripheral portion 302 were brought into the steady state, and then a molten material obtained by melt kneading the aforementioned masterbatch with the twin screw extruder 309 was supplied to the inside of the rotor 301 at a rate of 2 kg/hr through the double tube cylindrical body 305 from the top of the rotor 301 while degassing by use of a degasifier, and allowed to pass through a plurality of small pores of the cylindrical outer peripheral portion 302 by centrifugal force obtained by the rotation of the rotor 301, whereby a granular resin composition was obtained. Details of the production conditions were shown in Table 1.

Evaluation of Granular Resin Composition

The resulting granular resin composition was evaluated in the following manner, and its evaluation results were shown in Table 1.

Amount of particles having a size of 2 mm or greater, amount of particles having a size of 1 mm or greater, but less than 2 mm, and amount of microfine particles having a size of less than 106 µm:

40 g of the obtained granular resin composition was weighed up to 1 mg to give a sample. The JIS standard sieves having apertures of 2.00 mm, 1.00 mm and 106 µm installed in a ro-tap type sieve shaker (Model-SS-100A, manufactured by Marubishi Kagaku Kikai Seisakusho Co. Ltd.) were used to classify the sample through the sieves while shaking these sieves over a period of 20 minutes (number of hammer strokes: 120/minute). Subsequently, the mass of microfine particles passed through the sieve of 106 µm, the mass of particles remained on the sieve of 1 mm after passing through the sieve of 2 mm, and the mass of particles remained on the sieve of 2 mm were measured to obtain the mass ratio thereof to the total sample mass before classifying.

Ratio of particles having the longest length (L) of not more than 5 mm and the shortest length (S) of not more than 1 mm:

The JIS standard sieve having an aperture of 106 µm installed in a ro-tap type sieve shaker (Model-SS-100A, manufactured by Marubishi Kagaku Kikai Seisakusho Co. Ltd.) was used to classify a sample of the obtained granular resin composition through the sieve while shaking the sieve over a period of 20 minutes (number of hammer strokes: 120/minute) to remove particles having a size of less than 106 µm. Subsequently, 100 of particles remained on the sieve having a size of 106 µm were randomly selected, and the longest length (L) and the shortest length (S) of each single particle were measured for sorting between particles having the longest length (L) of not more than 5 mm and the shortest length (S) of not more than 1 mm, and other particles. Subsequently, the ratio of the total mass of particles having the longest length (L) of not more than 5 mm and the shortest length (S) of not more than 1 mm to the total mass of 100 particles before sorting was determined to give the ratio of particles having the longest length (L) of not more than 5 mm and the shortest length (S) of not more than 1 mm.

Repose Angle, Collapse Angle and Angle of Difference:

As shown in FIG. 5, a granular resin composition was put toward the center of the disk-like horizontal plate 205 having a diameter of 80 mm installed in a powder tester (Model-PT-E, a product of Hosokawa Micron Group) from the vertical direction using the funnel 201, whereby the conical granule 204 was formed on the horizontal plate 205. The granular resin composition was continuously put in until a cone was formed in a predetermined shape to determine the elevation angle (φ) using a protractor as shown in FIG. 5 to give a repose angle. Subsequently, a balance weight of 109 g placed on the pedestal 206 along with the horizontal plate 205 was allowed to fall downward three times from a height of 160 mm, apart of the granular resin composition was collapsed by the impact for falling out of the plate, and then the elevation angle (θ) was determined using a protractor as shown in FIG. 5 and the collapse angle was measured. Furthermore, the difference between the measured repose angle and the collapse angle was determined to give the angle of difference. As the determination criteria of the collapse angle, an angle of not more than 25 degrees was determined as AA, an angle of from more than 25 to not more than 30 degrees was determined as A, an angle of greater than 30 degrees was determined as B, and an angle of greater than 35 degrees was determined as C.

Figure 11:
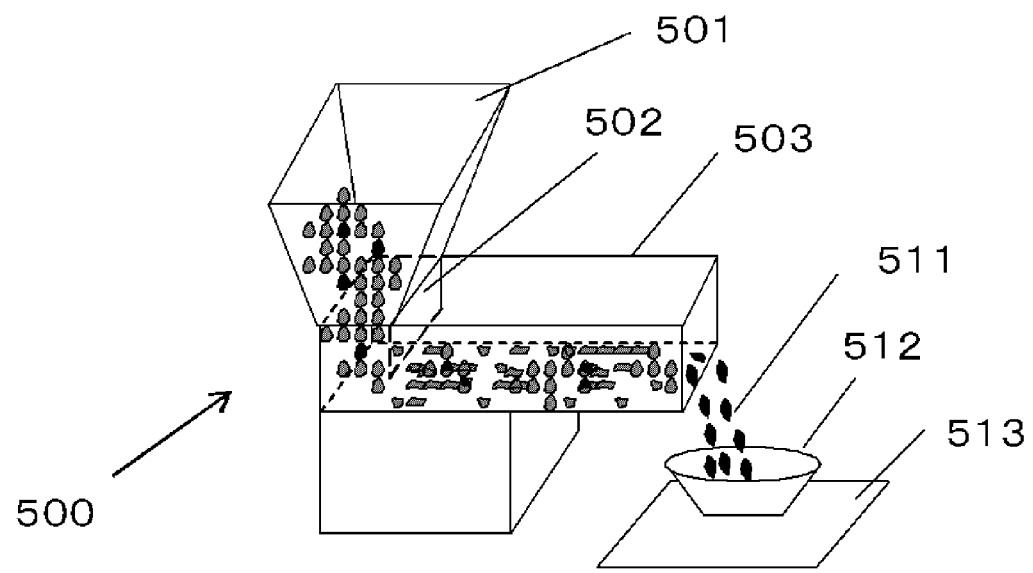
FIG. 11 is a schematic diagram illustrating a method of evaluating conveyance performance, uneven sprinkling and adhesion properties.

Uneven Sprinkling and Adhesion Properties:

As shown in FIG. 11, 120 g of the granular resin composition was put into a hopper 501 in a vibration feeder 500 (manufactured by A&D Co., Ltd., size of trough 503: 450 mm long×55 mm wide), a gap in a gate 502 was adjusted to 0.4 mm and shaken to a predetermined degree so as to have an initial convey speed of 10 g/minute to convey the granular resin composition, and a granular resin composition 511 was collected at a container 512 placed on a scale 513 to measure the mass every one minute and to examine the increased mass. Furthermore, after completion of the measurement, existence of particles or microfine particles in which resin particles were adhered to one another or attached to the inside of the feeder, or particles are clogged in the way was examined by visual observation. No adhesion, attachment or clogging occurred was indicated as AA, existence of adhesion, attachment or clogging occurred but with no trouble to continuous conveyance caused was indicated as A, plenty of adhesion, attachment or clogging occurred and accordingly a little deterioration of continued conveyance performance caused was indicated as B, and remarkable adhesion, attachment or clogging occurred and accordingly continued conveyance performance affected a lot was indicated as C. As the determination criteria of uneven sprinkling, the increased amounts of the mass after 1 minute, after 3 minutes, after 5 minutes, after 7 minutes and after 10 minutes were examined. In case that the difference of the increased amount of the mass after 10 minutes to the theoretical increased amount of the mass is in the range of ±1 g, AA was indicated. in case that it was in the range of ±2 g, A was indicated. Otherwise, C was indicated.

Figure 12:
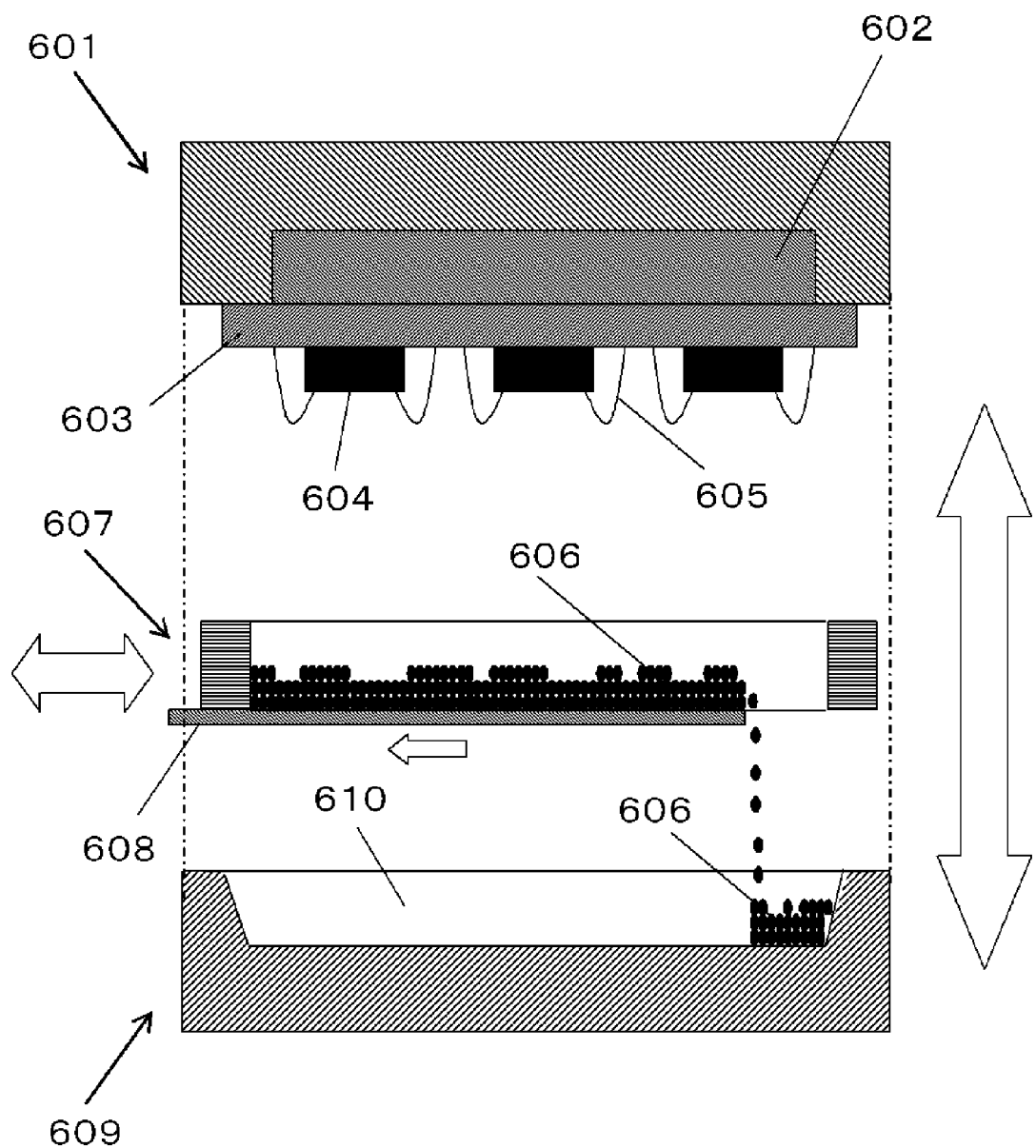
FIG. 12 is a schematic diagram illustrating a method of supplying a granular resin composition into a compression mold for the evaluation of the wire sweep rate and filling properties.
Figure 13:
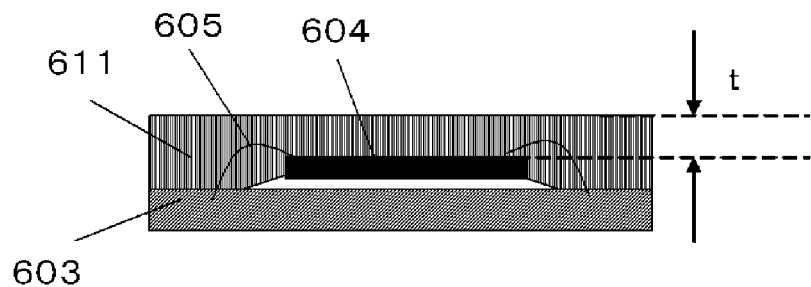
FIG. 13 is a schematic diagram illustrating a thickness (t) of an encapsulation material on a semiconductor element for the evaluation of the wire sweep rate.

Wire Sweep Rate:

As shown in FIG. 12, by conveying a specific amount using the vibration feeder, a resin material supplying container 607 containing a granular resin composition 606 was prepared, and was placed between an upper mold 601 and a lower mold 609 of a compression mold, and semiconductor elements 604 having a thickness of 0.25 mm and 10 mm square were attached on a circuit board 603 having a thickness of 0.5 mm, a width of 50 mm and a length of 210 mm composed of a glass fabric based epoxy resin copper-clad laminate sheet of heat resistance grade FR-4 using a silver paste and gold wires 605 having a width of 25 μm and a length of about 5 mm were joined to the semiconductor elements 604 and the circuit board 603 at pitch intervals of 60 μm. 12 of the resulting semiconductor elements were fixed to the upper mold 601 by a substrate fixing means 602 such that a surface on which the semiconductor elements 604 were mounted was directed downward. Subsequently, by laterally sliding a shutter 608 constituting the bottom surface of the resin material supplying container 607, the granular resin composition 606 was supplied into a lower cavity 610, and then the resin material supplying container 607 was taken out of the mold. Subsequently, 12 of semiconductor elements 604 were encapsulated and molded at one time using a compression molding machine (manufactured by TOWA Corp.) while reducing the pressure in the cavity, whereby a MAP molded product was obtained. The molding conditions at this time were a mold temperature of 175° C., a molding pressure of 3.9 MPa and a curing time of 120 seconds. Subsequently, the obtained MAP molded product was segmented into pieces by dicing, whereby a simulated semiconductor device (the semiconductor elements 604 and the gold wires 605 were encapsulated with an encapsulation material 611, that is, a cured product of the resin composition, and a thickness (t) of the encapsulation material 611 on the semiconductor elements 604 was 0.5 mm) was obtained as shown in FIG. 13. For the amount of wire sweep in the resulting simulated semiconductor device, an average sweep rate of 4 longest gold wires (length: 5 mm) on the diagonal line of the package using a soft X-ray apparatus (PRO-TEST-100, manufactured by Softex Corp.) was measured, whereby the wire sweep rate (wire sweep amount/wire length×100(%)) was calculated. As the evaluation criteria, the wire sweep rate of not less than 3% was determined as defective. Further, the wire sweep rate of less than 3%, but greater than 2% was determined as A, and the wire sweep rate of less than 2% was determined as AA.

Figure 14:
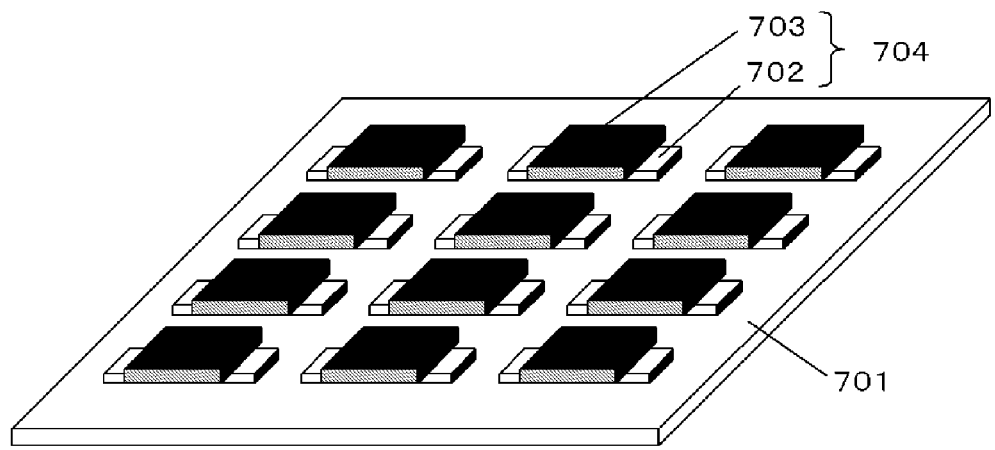
FIG. 14 is a schematic diagram illustrating a state of simulated elements mounted on a circuit board for the evaluation of filling properties.

Filling Properties:

As shown in FIG. 14, 12 of first semiconductor elements 702 having a thickness of 0.2 mm and 5×10 mm square were attached on a circuit board 701 having a thickness of 0.5 mm, a width of 50 mm and a length of 210 mm composed of a glass fabric based epoxy resin copper-clad laminate sheet of heat resistance grade FR-4 using a silver paste at equal intervals, and second semiconductor elements 703 of the same dimensions were further attached on respective corresponding first semiconductor elements 702 using the aforementioned silver paste at the position of 90 degrees rotated on the XY plane with respect to the first semiconductor elements 702, whereby simulated elements 704 were prepared. Subsequently, the same compression mold as that used for evaluation of the wire sweep rate was used, and 12 of simulated elements 704 were encapsulated and molded at one time by use of a compression molding machine (manufactured by TOWA Corp.) in the same manner as in evaluation of the wire sweep rate, whereby a MAP molded product of a simulated semiconductor device having a thickness (t) of the encapsulation material of 0.3 mm on the simulated elements 704 was obtained. The molding conditions at this time were a mold temperature of 175° C., a molding pressure of 3.9 MPa and a curing time of 120 seconds. Filling properties were evaluated using a scanning acoustic tomograph (mi-scope hyper II, manufactured by Hitachi Kenki Fine Tech Co., Ltd.) without segmenting the obtained MAP molded product into pieces. Among 12 simulated elements, perfect filling in the periphery of all simulated elements was determined as A, defective filling such as nests, voids or the like occurred in the periphery of 1 to 5 simulated elements was determined as B, and defective filling such as nests, voids or the like occurred in the periphery of 6 or more simulated elements was determined as C. The obtained results were shown in Table 1.

Examples 1-2 to 1-8, 1-12 to 1-15, and Comparative Examples 1-1 to 1-3

According to the conditions in Table 1, granular resin compositions were obtained in the same manner as in Example 1-1 and respective tests were conducted in the same manner. The obtained results were shown in Table 1.

Comparative Example 1-4

The resin composition raw materials were pulverized and mixed by use of a super mixer for 5 minutes, and then melt-kneaded at a kneading temperature of 100° C. by use of the twin screw extruder 309, and further cooled with a cooling belt, and then coarsely pulverized with a hammer mill, whereby a coarse pulverized product having an average particle diameter of 800 μm and a particle size distribution of 40 μm to 10 mm was obtained. The obtained coarse pulverized product was further pulverized by 4,000 rotations using a pulverizer, whereby a granular resin composition was obtained and the tests were conducted in the same manner as in Example 1-1. The obtained results were shown in Table 2.

Examples 1-9 to 1-11, and Comparative Examples 1-5 to 1-7

JIS standard sieves having apertures of 2.00 mm, 1.00 mm and 106 μm installed in a ro-tap type sieve shaker were used to classify a sample of the granular resin composition obtained in Comparative Example 1-4 through sieves while shaking these sieves over a period of 20 minutes (number of hammer strokes: 120/minute), and respective classifying components of the granular resin composition were mixed so as to have the particle size distribution as shown in Table 2, whereby a resin composition having a predetermined particle size distribution was obtained and the tests were conducted in the same manner as in Example 1-1. The obtained results were shown in Table 2.

TABLE 1

| | | | Example | | | |
|---|---|---|---|---|---|---|
| | | | 1-1 | 1-2 | 1-3 | 1-4 |
| Production Method | | | Centrifugal Powdering Method | | | |
| Production Condition | Kneading temperature of the twin screw extruder | [° C.] | 95 | 100 | 110 | 100 |
| | Number of rotations of the rotor | [RPM] | 3000 | 3000 | 3000 | 3000 |
| | Temperature of the cylindrical outer peripheral portion | [° C.] | 115 | 115 | 115 | 115 |
| | Pore size of small pores | [mm] | 2.5 | 2.5 | 2.5 | 2.0 |
| Particle Size Distribution | Ratio of particles having a size of 2 mm or greater | [mass %] | 1.6 | 1.0 | 0.8 | 0.1 |
| | Ratio of particles having a size of 1 mm or greater, but less than 2 mm | [mass %] | 56.0 | 33.0 | 18.0 | 28.0 |
| | Ratio of microfine particles having a size of less than 106 μm | [mass %] | 2.4 | 2.2 | 2.0 | 3.6 |
| | Ratio of particles having the longest length (L) of not more than 5 mm and the shortest length (S) of not more than 1 mm | [mass %] | 72 | 82 | 86 | 82 |
| Collapse Angle | Repose angle | [°] | 38 | 37 | 36 | 39 |
| | Collapse angle | [°] | 22 | 15 | 18 | 24 |
| | Collapse angle Determination | [—] | AA | AA | AA | AA |
| | Angle of difference | [°] | 16 | 22 | 18 | 15 |
| Evaluation Results | Uneven sprinkling | Increased amount of mass after 1 minute | [g] | 9.9 | 10.0 | 10.0 | 9.9 |
| | | Increased amount of mass after 3 minutes | [g] | 29.6 | 30.2 | 30.2 | 30.2 |
| | | Increased amount of mass after 5 minutes | [g] | 49.8 | 50.2 | 50.3 | 50.3 |
| | | Increased amount of mass after 7 minutes | [g] | 69.7 | 70.3 | 70.2 | 69.9 |
| | | Increased amount of mass after 10 minutes | [g] | 98.9 | 100.1 | 100.3 | 99.2 |
| | | Determination | [—] | A | AA | AA | AA |
| | Adhesion properties | Existence of adhesion among resin particles | [—] | AA | AA | AA | A |
| | | Existence of attachment to the inside of the feeder | [—] | AA | AA | AA | AA |
| | | Existence of clogging | [—] | A | AA | A | AA |
| | Wire sweep | Wire sweep rate | [%] | 2.4 | 1.2 | 1.4 | 2.2 |
| | | Determination | [—] | A | AA | AA | A |
| | Filling properties | | [—] | A | A | A | A |

| | | | Example | | | |
|---|---|---|---|---|---|---|
| | | | 1-5 | 1-6 | 1-7 | 1-8 |
| Production Method | | | Centrifugal Powdering Method | | | |
| Production Condition | Kneading temperature of the twin screw extruder | [° C.] | 100 | 100 | 100 | 100 |
| | Number of rotations of the rotor | [RPM] | 2000 | 3500 | 3000 | 3000 |
| | Temperature of the cylindrical outer peripheral portion | [° C.] | 115 | 115 | 100 | 120 |
| | Pore size of small pores | [mm] | 2.5 | 2.5 | 2.5 | 2.5 |

TABLE 1-continued

|  |  |  |  |  |  |  |
|---|---|---|---|---|---|---|
| Particle Size Distribution | Ratio of particles having a size of 2 mm or greater | [mass %] | 1.2 | 0.3 | 1.0 | 1.0 |
|  | Ratio of particles having a size of 1 mm or greater, but less than 2 mm | [mass %] | 38.0 | 22.0 | 42.0 | 13.0 |
|  | Ratio of microfine particles having a size of less than 106 μm | [mass %] | 2.0 | 2.6 | 1.8 | 2.0 |
|  | Ratio of particles having the longest length (L) of not more than 5 mm and the shortest length (S) of not more than 1 mm | [mass %] | 80 | 84 | 76 | 80 |
| Collapse Angle | Repose angle | [°] | 38 | 39 | 38 | 38 |
|  | Collapse angle — Collapse angle | [°] | 18 | 15 | 16 | 21 |
|  | Collapse angle — Determination | [—] | AA | AA | AA | AA |
|  | Angle of difference | [°] | 20 | 24 | 22 | 17 |
| Evaluation Results | Uneven sprinkling — Increased amount of mass after 1 minute | [g] | 10.0 | 10.0 | 10.0 | 10.0 |
|  | Increased amount of mass after 3 minutes | [g] | 30.1 | 30.1 | 30.1 | 30.0 |
|  | Increased amount of mass after 5 minutes | [g] | 50.2 | 50.2 | 50.1 | 50.1 |
|  | Increased amount of mass after 7 minutes | [g] | 70.1 | 70.2 | 70.1 | 69.9 |
|  | Increased amount of mass after 10 minutes | [g] | 100.2 | 100.1 | 100.2 | 100.1 |
|  | Determination | [—] | AA | AA | AA | AA |
|  | Adhesion properties — Existence of adhesion among resin particles | [—] | AA | AA | AA | AA |
|  | Existence of attachment to the inside of the feeder | [—] | AA | AA | AA | A |
|  | Existence of clogging | [—] | AA | AA | A | AA |
|  | Wire sweeping — Wire sweep rate | [%] | 1.4 | 1.2 | 1.8 | 2.1 |
|  | Wire sweeping — Determination | [—] | AA | AA | AA | A |
|  | Filling properties | [—] | A | A | A | A |

|  |  |  | Example | | | |
|---|---|---|---|---|---|---|
|  |  |  | 1-12 | 1-13 | 1-14 | 1-15 |
| Production Method |  |  | Centrifugal Powdering Method | | | |
| Production Condition | Kneading temperature of the twin screw extruder | [° C.] | 100 | 110 | 100 | 100 |
|  | Number of rotations of the rotor | [RPM] | 3000 | 3000 | 2000 | 3500 |
|  | Temperature of the cylindrical outer peripheral portion | [° C.] | 115 | 115 | 115 | 115 |
|  | Pore size of small pores | [mm] | 1.5 | 1.5 | 1.5 | 1.5 |
| Particle Size Distribution | Ratio of particles having a size of 2 mm or greater | [mass %] | 0.0 | 0.0 | 0.1 | 0.0 |
|  | Ratio of particles having a size of 1 mm or greater, but less than 2 mm | [mass %] | 2.8 | 0.8 | 3.8 | 1.2 |
|  | Ratio of microfine particles having a size of less than 106 μm | [mass %] | 1.8 | 2.2 | 2.5 | 3.5 |
|  | Ratio of particles having the longest length (L) of not more than 5 mm and the shortest length (S) of not more than 1 mm | [mass %] | 82 | 86 | 80 | 84 |
| Collapse Angle | Repose angle | [°] | 40 | 39 | 40 | 40 |
|  | Collapse angle — Collapse angle | [°] | 25 | 25 | 26 | 24 |
|  | Collapse angle — Determination | [—] | AA | AA | AA | AA |
|  | Angle of difference | [°] | 15 | 14 | 14 | 16 |

TABLE 1-continued

| Evaluation Results | Uneven sprinkling | Increased amount of mass after 1 minute | [g] | 10.0 | 10.0 | 10.0 | 10.0 |
|---|---|---|---|---|---|---|---|
| | | Increased amount of mass after 3 minutes | [g] | 30.1 | 30.2 | 30.1 | 30.2 |
| | | Increased amount of mass after 5 minutes | [g] | 50.2 | 50.3 | 50.1 | 50.2 |
| | | Increased amount of mass after 7 minutes | [g] | 70.3 | 70.2 | 70.2 | 70.3 |
| | | Increased amount of mass after 10 minutes | [g] | 100.2 | 100.2 | 100.2 | 100.2 |
| | | Determination | [—] | AA | AA | AA | AA |
| | Adhesion properties | Existence of adhesion among resin particles | [—] | A | A | A | A |
| | | Existence of attachment to the inside of the feeder | [—] | AA | AA | AA | AA |
| | | Existence of clogging | [—] | AA | A | A | A |
| | Wire sweep | Wire sweep rate | [%] | 2.3 | 2.5 | 2.5 | 2.2 |
| | | Determination | [—] | A | A | A | A |
| | Filling properties | | [—] | A | A | A | A |

|   |   |   |   | Comparative Example | | |
|---|---|---|---|---|---|---|
|   |   |   |   | 1-1 | 1-2 | 1-3 |
| Production Method | | | | Centrifugal Powdering Method | | |
| Production Condition | Kneading temperature of the twin screw extruder | | [° C.] | 90 | 100 | 100 |
| | Number of rotations of the rotor | | [RPM] | 3000 | 3000 | 3500 |
| | Temperature of the cylindrical outer peripheral portion | | [° C.] | 115 | 115 | 120 |
| | Pore size of small pores | | [mm] | 2.5 | 3.0 | 2.0 |
| Particle Size Distribution | Ratio of particles having a size of 2 mm or greater | | [mass %] | 1.5 | 5.2 | 0.8 |
| | Ratio of particles having a size of 1 mm or greater, but less than 2 mm | | [mass %] | 68.0 | 60.0 | 18.0 |
| | Ratio of microfine particles having a size of less than 106 μm | | [mass %] | 2.7 | 1.2 | 7.2 |
| | Ratio of particles having the longest length (L) of not more than 5 mm and the shortest length (S) of not more than 1 mm | | [mass %] | 56 | 36 | 76 |
| Collapse Angle | Repose angle | | [°] | 38 | 42 | 39 |
| | Collapse angle | Collapse angle | [°] | 25 | 25 | 29 |
| | | Determination | [—] | AA | AA | A |
| | Angle of difference | | [°] | 13 | 17 | 10 |
| Evaluation Results | Uneven sprinkling | Increased amount of mass after 1 minute | [g] | 9.9 | 9.9 | 10.0 |
| | | Increased amount of mass after 3 minutes | [g] | 29.9 | 29.8 | 30.2 |
| | | Increased amount of mass after 5 minutes | [g] | 49.8 | 49.4 | 49.4 |
| | | Increased amount of mass after 7 minutes | [g] | 69.2 | 68.7 | 68.7 |
| | | Increased amount of mass after 10 minutes | [g] | 97.9 | 95.6 | 97.8 |
| | | Determination | [—] | C | C | C |

TABLE 1-continued

| | | | | | |
|---|---|---|---|---|---|
| Adhesion properties | Existence of adhesion among resin particles | [—] | A | AA | B |
| | Existence of attachment to the inside of the feeder | [—] | A | AA | B |
| | Existence of clogging | [—] | B | C | B |
| Wire sweep | Wire sweep rate | [%] | 3.6 | 3.2 | 3.2 |
| | Determination | [—] | C | C | C |
| Filling properties | | [—] | C | C | B |

TABLE 2

| | | | Comp. Example | Example | | |
|---|---|---|---|---|---|---|
| | | | 1-4 | 1-9 | 1-10 | 1-11 |
| Production Method | | | Pulverized product | Pulverizing-sieving Method | | |
| Particle Size Distribution | Ratio of particles having a size of 2 mm or greater | [mass %] | 4.2 | 0.8 | 1.0 | 1.2 |
| | Ratio of particles having a size of 1 mm or greater, but less than 2 mm | [mass %] | 40.0 | 18.0 | 33.0 | 56.0 |
| | Ratio of microfine particles having a size of less than 106 µm | [mass %] | 11.2 | 2.0 | 2.2 | 2.4 |
| | Ratio of particles having the longest length (L) of not more than 5 mm and the shortest length (S) of not more than 1 mm | [mass %] | 44 | 64 | 60 | 62 |
| Collapse Angle | Repose angle | [°] | 42 | 37 | 39 | 40 |
| | Collapse angle — Collapse angle | [°] | 36 | 18 | 20 | 23 |
| | Collapse angle — Determination | [—] | C | AA | AA | AA |
| | Angle of difference | [°] | 6 | 19 | 19 | 17 |
| Evaluation Results | Uneven sprinkling — Increased amount of mass after 1 minute | [g] | 9.8 | 10.0 | 10.0 | 10.0 |
| | Increased amount of mass after 3 minutes | [g] | 29.2 | 30.2 | 30.2 | 29.9 |
| | Increased amount of mass after 5 minutes | [g] | 49.4 | 50.0 | 50.1 | 49.6 |
| | Increased amount of mass after 7 minutes | [g] | 68.9 | 69.8 | 69.9 | 69.6 |
| | Increased amount of mass after 10 minutes | [g] | 93.2 | 99.6 | 99.7 | 98.9 |
| | Determination | [—] | C | AA | AA | A |
| | Adhesion properties — Existence of adhesion among resin particles | [—] | C | A | A | A |
| | Existence of attachment to the inside of the feeder | [—] | C | A | A | A |
| | Existence of clogging | [—] | C | A | A | A |
| | Wire sweep — Wire sweep rate | [%] | 3.4 | 1.8 | 1.5 | 2.2 |
| | Determination | [—] | C | AA | AA | A |
| | Filling properties | [—] | C | A | A | A |

TABLE 2-continued

|  |  |  | | Comparative Example | | |
|---|---|---|---|---|---|---|
|  |  |  | | 1-5 | 1-6 | 1-7 |
| Production Method |  |  |  | Pulverizing-sieving Method | | |
| Particle Size Distribution | Ratio of particles having a size of 2 mm or greater | | [mass %] | 1.6 | 1.2 | 4.3 |
|  | Ratio of particles having a size of 1 mm or greater, but less than 2 mm | | [mass %] | 66.0 | 50.4 | 55.0 |
|  | Ratio of microfine particles having a size of less than 106 μm | | [mass %] | 2.8 | 8.0 | 1.0 |
|  | Ratio of particles having the longest length (L) of not more than 5 mm and the shortest length (S) of not more than 1 mm | | [mass %] | 46 | 63 | 42 |
| Collapse Angle | Repose angle | | [°] | 40 | 39 | 42 |
|  | Collapse | Collapse angle | [°] | 24 | 25 | 30 |
|  | Angle | Determination | [—] | AA | AA | A |
|  | Angle of difference | | [°] | 16 | 14 | 12 |
| Evaluation Results | Uneven sprinkling | Increased amount of mass after 1 minute | [g] | 9.9 | 10.0 | 10.0 |
|  |  | Increased amount of mass after 3 minutes | [g] | 29.8 | 29.9 | 30.1 |
|  |  | Increased amount of mass after 5 minutes | [g] | 49.7 | 49.7 | 49.6 |
|  |  | Increased amount of mass after 7 minutes | [g] | 69.2 | 69.0 | 68.9 |
|  |  | Increased amount of mass after 10 minutes | [g] | 97.6 | 95.3 | 97.3 |
|  |  | Determination | [—] | C | C | C |
|  | Adhesion properties | Existence of adhesion among resin particles | [—] | A | C | A |
|  |  | Existence of attachment to the inside of the feeder | [—] | B | C | B |
|  |  | Existence of clogging | [—] | B | A | C |
|  | Wire sweep | Wire sweep rate | [%] | 3.8 | 3.2 | 3.1 |
|  |  | Determination | [—] | C | C | C |
|  | Filling properties | | [—] | C | B | B |

For all resin compositions in Examples 1-1 to 1-15, in the particle size distribution as determined by sieving the whole resin composition using JIS standard sieves, the ratio of particles having a size of 2 mm or greater is not more than 3% by mass, the ratio of particles having a size of 1 mm or greater, but less than 2 mm is from 0.5% by mass or more to 60% by mass or less, and the ratio of microfine particles having a size of less than 106 μm is not more than 5% by mass. As a result, uneven sprinkling, adhesion or the like did not almost occur, wire sweep was small, and filling properties were also excellent.

Second Granular Epoxy Resin Composition for Encapsulating Semiconductor

Example 2-1

Mixing of Resin Composition (Part by Mass)

Epoxy resin 1: 8.0 parts by mass of a phenol aralkyl type epoxy resin having a biphenylene structure (NC-3000, manufactured by Nippon Kayaku Co., Ltd., softening point: 58° C., epoxy equivalent: 277)

Epoxy resin 2: 2.0 parts by mass of a bisphenol A type epoxy resin (YL6810, manufactured by Japan Epoxy Resins Co., Ltd., melting point: 45° C., epoxy equivalent: 172)

Phenolic resin 1: 8.0 parts by mass of a phenol aralkyl resin having a biphenylene structure (GPL-65, manufactured by Nippon Kayaku Co., Ltd., softening point: 65° C., hydroxyl equivalent: 198)

Curing accelerator (triphenylphosphine) 0.2 parts by mass

Inorganic filling material (molten spherical silica having an average particle diameter of 16 μm)

81.2 parts by mass

Carnauba wax 0.1 part by mass

Carbon black 0.3 parts by mass

Coupling agent 0.2 parts by mass

Preparation of Masterbatch

The above mixed resin composition raw materials were pulverized and mixed by use of a super mixer for 5 minutes, and the mixed raw materials were prepared.

Production of Granular Resin Composition

A punched metallic mesh made of iron having small pores of a pore diameter of 2.5 mm was used as a material of the cylindrical outer peripheral portion 302 illustrated in FIG. 6. A punched metallic mesh having a height of 25 mm and a thickness of 1.5 mm processed into a cylindrical shape was installed on the periphery of the rotor 301 having a diameter of 20 cm, whereby the cylindrical outer peripheral portion 302 was formed. The cylindrical outer peripheral portion 302 was heated with the exciting coil at 115° C. by the rotation of the rotor 301 at a speed of 3,000 rpm. The number of rotations of the rotor 301 and the temperature of the cylindrical outer peripheral portion 302 were brought into the steady state, and then a molten material obtained by melt kneading the aforementioned masterbatch with the twin screw extruder 309 was supplied to the inside of the rotor 301 at a rate of 2 kg/hr through the double tube cylindrical body 305 from the top of the rotor 301 while degassing by use of a degasifier, and allowed to pass through a plurality of small pores of the cylindrical outer peripheral portion 302 by centrifugal force obtained by the rotation of the rotor 301, whereby a granular resin composition was obtained. Details of the production conditions were shown in Table 3.

Evaluation Method

Granule density (D1):

JIS standard sieves having an aperture of 106 μm installed in a ro-tap type sieve shaker (Model-SS-100A, manufactured by Marubishi Kagaku Kikai Seisakusho Co. Ltd.) were used to classify a sample of the obtained granular resin composition through sieves while shaking these sieves over a period of 20 minutes (number of hammer strokes: 120/minute) to remove microfine particles having a size of less than 106 μm. Subsequently, the granule density was determined according to the aforementioned pycnometer method.

Specific Gravity (D2) of a Cured Product:

The obtained granular resin composition was once made into a tablet having a predetermined size, and a disk having a diameter of 50 mm and a thickness of 3 mm was formed at a mold temperature of 175±5° C. and an injection pressure of 7 MPa for a curing time of 120 seconds using a transfer molding machine, and the specific gravity of a cured product was calculated by determining the mass and volume.

Conveyance Performance and Adhesion Properties:

300 g of the sample of the granular resin composition was supplied to the hopper 501 of the vibration feeder 500 (manufactured by A&D Co., Ltd., gap of gate 502: 0.4 mm, size of trough 503: 450 mm long×55 mm wide) as shown in FIG. 11, and then strength of the vibration was adjusted so as to have an initial convey speed of 10 g/minute to measure the time involved in conveying 300 g. After conveyance, the state such as adhesion among particles, attachment to the vibration feeder 500, clogging in the way or the like was observed. As the determination criteria of conveyance performance, the conveyance time of within (29 minutes) was taken as A, the time in the range of (29 minutes) to (30 minutes) was taken as B, the time in the range of (30 minutes) to (31 minutes) was taken as C, the time in the range of (31 minutes) to (32 minutes) was taken as D, and the time over (32 minutes) was taken as E, of which A, B and C were acceptable. Furthermore, the number of vibrations in the test of conveyance performance was measured with the same number of vibrations without being changed in other Examples and Comparative Examples. As the determination criteria of adhesion properties, no adhesion, attachment or clogging occurred was indicated as AA, existence of adhesion, attachment or clogging occurred but with no trouble during continuous conveyance caused was indicated as A, plenty of adhesion, attachment or clogging occurred and accordingly a little deterioration of continued conveyance performance caused was indicated as B, and remarkable adhesion, attachment or clogging occurred and accordingly continued conveyance performance affected a lot was indicated as C.

Filling Properties:

As shown in FIG. 12, by conveying a specific amount using the vibration feeder, the resin material supplying container 607 containing the granular resin composition 606 was prepared, and was placed between the upper mold 601 and the lower mold 609 of the compression mold, and 12 of semiconductor elements 604 having a thickness of 0.25 mm and 10 mm square attached on the circuit board 603 having a thickness of 0.5 mm, a width of 50 mm and a length of 210 mm composed of a glass fabric based epoxy resin copper-clad laminate sheet of heat resistance grade FR-4 using a silver paste were fixed to the upper mold 601 by the substrate fixing means 602 such that a surface on which the semiconductor elements 604 were mounted was directed downward. Subsequently, by laterally sliding the shutter 608 constituting the bottom surface of the resin material supplying container 607, the granular resin composition 606 was supplied into the lower cavity 610, and then the resin material supplying container 607 was taken out of the mold. Subsequently, 12 of semiconductor elements 604 were encapsulated and molded at one time using a compression molding machine (manufactured by TOWA Corp.) while reducing the pressure in the cavity, whereby a MAP molded product was obtained. The molding conditions at this time were a mold temperature of 175° C., a molding pressure of 3.9 MPa and a curing time of 120 seconds. Filling properties were evaluated using a scanning acoustic tomograph (mi-scope hyper II, manufactured by Hitachi Kenki Fine Tech Co., Ltd.) without segmenting the obtained MAP molded product into pieces. Among 12 simulated elements, perfect filling in the periphery of all simulated elements was determined as A, defective filling such as nests, voids or the like occurred in the periphery of 1 to 5 simulated elements was determined as B, and defective filling such as nests, voids or the like occurred in the periphery of 6 or more simulated elements was determined as C. The obtained results were shown in Table 3.

Examples 2-2 to 2-14, and Comparative Example 2-1

Granular resin compositions were prepared in the same manner as in Example 2-1, except that the amount of the inorganic filling material and production conditions of the granular resin composition in Example 2-1 were changed to those in Table 3. On the other hand, in Comparative Example 2-1, kneading was performed without degassing during melt kneading by use of a twin screw extruder. The tests were conducted in the same manner as in Example 2-1, and the obtained results were shown in Table 3.

Comparative Example 2-2

The raw materials having compositions in Example 2-1 were pulverized and mixed by use of a super mixer for 5 minutes, and then melt-kneaded at a kneading temperature of 100° C. by use of the twin screw extruder 309 while degassing using a degasifier, and further cooled with a cooling belt, and then coarsely pulverized with a hammer mill, whereby a coarse pulverized product having an average particle diameter of 800 μm and a particle size distribution of 40 μm to 10 mm was obtained. The obtained coarse pulverized product was further pulverized by 4,000 rotations using a pulverizer, whereby a granular resin composition was obtained. The tests were conducted in the same manner as in Example 2-1, and the obtained results were shown in Table 4.

Comparative Examples 2-3 and 2-4

JIS standard sieves having apertures of 106 μm and 2 mm installed in a ro-tap type sieve shaker (Model-SS-100A, manufactured by Marubishi Kagaku Kikai Seisakusho Co. Ltd.) were further used to classify a sample of the granular resin composition obtained in Comparative Example 2-2 through sieves while shaking these sieves over a period of 20 minutes (number of hammer strokes: 120/minute) which was classified into components having a size of less than 106 μm, components having a size of 106 μm or greater, but less than 2 mm, and components having a size of 2 mm or greater, and respective components were adjusted so as to have the distributions in Table 4, whereby a granular resin composition was prepared. The tests were conducted in the same manner as in Example 2-1, and the obtained results were shown in Table 4.

Comparative Example 2-5

The raw materials having compositions of Example 2-1 with the amount of an inorganic filling material as illustrated in Table 4 were pulverized and mixed by use of a super mixer for 5 minutes, and then melt-kneaded at a kneading temperature of 100° C. by use of the twin screw extruder 309 while degassing using a degasifier, and further cooled with a cooling belt, and then coarsely pulverized with a hammer mill, whereby a coarse pulverized product having an average particle diameter of 800 μm and a particle size distribution of 40 μm to 10 mm was obtained. The obtained coarse pulverized product was further pulverized by 4,000 rotations using a pulverizer, and then JIS standard sieves having apertures of 106 μm and 2 mm installed in a ro-tap type sieve shaker (Model-SS-100A, manufactured by Marubishi Kagaku Kikai Seisakusho Co. Ltd.) were used to classify a sample through sieves while shaking these sieves over a period of 20 minutes (number of hammer strokes: 120/minute) which was classified into components having a size of less than 106 μm, components having a size of 106 μm or greater, but less than 2 mm, and components having a size of 2 mm or greater, and respective components were adjusted so as to have the distributions in Table 4, whereby a granular resin composition was prepared. The tests were conducted in the same manner as in Example 2-1, and the obtained results were shown in Table 4.

TABLE 3

|  |  |  | Example | | | | |
|---|---|---|---|---|---|---|---|
|  |  |  | 2-1 | 2-2 | 2-3 | 2-4 | 2-5 |
| Amount of the inorganic filling material contained in the resin composition | | [mass %] | 81.2 | 85 | 88 | 75 | 81.2 |
| Production Method | | | Centrifugal Powdering Method | | | | |
| Production Conditions | Kneading temperature of the twin screw extruder | [° C.] | 100 | 100 | 100 | 100 | 100 |
|  | Existence of degassing in the twin screw extruder | [—] | Yes | Yes | Yes | Yes | Yes |
|  | Number of rotations of the rotor | [RPM] | 3000 | 3000 | 3000 | 3000 | 3000 |
|  | Temperature of the cylindrical outer peripheral portion | [° C.] | 115 | 115 | 115 | 115 | 115 |
|  | Pore size of small pores | [mm] | 2.5 | 2.5 | 2.5 | 2.0 | 2.0 |
| Particle Size Distribution | Ratio of particles having a size of 2 mm or greater | [mass %] | 1.2 | 1.0 | 0.8 | 0.1 | 1.2 |
|  | Ratio of microfine particles having a size of less than 106 μm | [mass %] | 1.6 | 2.2 | 2.0 | 2.0 | 2.4 |
| Granule Density | Granule density (D1) | [g/cm$^3$] | 1.78 | 1.80 | 1.88 | 1.80 | 1.84 |
|  | Specific gravity (D2) | [g/cm$^3$] | 1.93 | 1.94 | 2.01 | 1.91 | 1.93 |
|  | D1/D2 | [—] | 0.92 | 0.93 | 0.94 | 0.90 | 0.95 |
| Evaluation Results | Conveyance performance (Conveyance time) | [—] | B | B | B | A | C |
|  | Adhesion properties | Existence of adhesion among resin particles | [—] | AA | AA | AA | AA | AA |
|  |  | Existence of attachment to the inside of the feeder | [—] | AA | AA | AA | AA | A |
|  |  | Existence of clogging | [—] | AA | AA | AA | AA | AA |
|  | Filling properties | [—] | A | A | A | A | A |

|  |  |  | Example | | | | |
|---|---|---|---|---|---|---|---|
|  |  |  | 2-6 | 2-7 | 2-8 | 2-9 | 2-10 |
| Amount of the inorganic filling material contained in the resin composition | | [mass %] | 81.2 | 81.2 | 81.2 | 81.2 | 85 |
| Production Method | | | Centrifugal Powdering Method | | | | |
| Production Conditions | Kneading temperature of the twin screw extruder | [° C.] | 115 | 100 | 100 | 100 | 100 |
|  | Existence of degassing in the twin screw extruder | [—] | Yes | Yes | Yes | Yes | Yes |

TABLE 3-continued

|  |  |  |  |  |  |  |  |
|---|---|---|---|---|---|---|---|
|  | Number of rotations of the rotor | [RPM] | 3000 | 2000 | 3000 | 3000 | 3000 |
|  | Temperature of the cylindrical outer peripheral portion | [° C.] | 115 | 100 | 120 | 115 | 115 |
|  | Pore size of small pores | [mm] | 2.5 | 2.5 | 2.5 | 1.5 | 1.5 |
| Particle size distribution | Ratio of particles having a size of 2 mm or greater | [mass %] | 0.3 | 2.1 | 1.0 | 0.1 | 0.0 |
|  | Ratio of microfine particles having a size of less than 106 μm | [mass %] | 2.6 | 1.8 | 2.0 | 2.6 | 2.8 |
| Granule Density | Granule density (D1) | [g/cm$^3$] | 1.83 | 1.76 | 1.84 | 1.86 | 1.89 |
|  | Specific gravity (D2) | [g/cm$^3$] | 1.93 | 1.93 | 1.93 | 1.93 | 1.94 |
|  | D1/D2 | [—] | 0.95 | 0.91 | 0.95 | 0.96 | 0.97 |
| Evaluation Results | Conveyance performance (Conveyance time) | [—] | C | B | C | C | C |
|  | Adhesion properties — Existence of adhesion among resin particles | [—] | AA | AA | AA | AA | AA |
|  | Existence of attachment to the inside of the feeder | [—] | A | AA | AA | AA | AA |
|  | Existence of clogging | [—] | AA | AA | AA | AA | AA |
|  | Filling properties | [—] | A | A | A | A | A |

|  |  |  | Example |  |  |  | Comp. Example |
|---|---|---|---|---|---|---|---|
|  |  |  | 2-11 | 2-12 | 2-13 | 2-14 | 2-1 |
| Amount of the inorganic filling material contained in the resin composition |  | [mass %] | 88 | 81.2 | 81.2 | 81.2 | 81.2 |
| Production Method |  |  | Centrifugal Powdering Method |  |  |  |  |
| Production Conditions | Kneading temperature of the twin screw extruder | [° C.] | 100 | 115 | 100 | 100 | 95 |
|  | Existence of degassing in the twin screw extruder | [—] | Yes | Yes | Yes | Yes | No |
|  | Number of rotations of the rotor | [RPM] | 3000 | 3000 | 2000 | 3000 | 2000 |
|  | Temperature of the cylindrical outer peripheral portion | [° C.] | 115 | 115 | 100 | 120 | 110 |
|  | Pore size of small pores | [mm] | 1.5 | 1.5 | 1.5 | 1.5 | 2.5 |
| Particle size distribution | Ratio of particles having a size of 2 mm or greater | [mass %] | 0.0 | 0.0 | 0.1 | 0.0 | 2.4 |
|  | Ratio of microfine particles having a size of less than 106 μm | [mass %] | 2.6 | 3.0 | 2.6 | 2.8 | 1.6 |
| Granule Density | Granule density (D1) | [g/cm$^3$] | 1.9 | 1.87 | 1.86 | 1.86 | 1.66 |
|  | Specific gravity (D2) | [g/cm$^3$] | 2.01 | 1.93 | 1.93 | 1.93 | 1.93 |
|  | D1/D2 | [—] | 0.95 | 0.97 | 0.96 | 0.96 | 0.86 |
| Evaluation Results | Conveyance performance (Conveyance time) | [—] | C | C | C | C | B |
|  | Adhesion properties — Existence of adhesion among resin particles | [—] | AA | AA | AA | AA | A |
|  | Existence of attachment to the inside of the feeder | [—] | AA | A | AA | AA | A |
|  | Existence of clogging | [—] | AA | AA | AA | AA | A |
|  | Filling properties | [—] | A | A | A | A | C |

TABLE 4

|  |  | | Comparative Example | | | |
|---|---|---|---|---|---|---|
|  |  | | 2-2 | 2-3 | 2-4 | 2-5 |
| Amount of the inorganic filling material contained in the resin composition | | [mass %] | 81.2 | 81.2 | 81.2 | 88 |
| Production Method | | | Pulverized product | Pulverizing-sieving Method | | |
| Particle Size Distribution | Ratio of particles having a size of 2 mm or greater | [mass %] | 5.2 | 5.2 | 0.8 | 0.2 |
|  | Ratio of microfine particles having a size of less than 106 μm | [mass %] | 12.3 | 1.2 | 7.2 | 2.2 |
| Granule Density | Granule density (D1) | [g/cm³] | 1.85 | 1.85 | 1.85 | 1.97 |
|  | Specific gravity (D2) | [g/cm³] | 1.93 | 1.93 | 1.93 | 2.01 |
|  | D1/D2 | [—] | 0.96 | 0.96 | 0.97 | 0.98 |
| Evaluation Results | Conveyance performance (Conveyance time) | [—] | E | D | E | D |
|  | Adhesion properties — Existence of adhesion among resin particles | [—] | C | A | B | A |
|  | Existence of attachment to the inside of the feeder | [—] | B | A | B | A |
|  | Existence of clogging | [—] | C | B | B | A |
|  | Filling properties | [—] | C | B | B | A |

For all resin compositions of Examples 2-1 to 2-14, in the particle size distribution as determined by sieving the whole resin composition using JIS standard sieves, the ratio of coarse particles having a size of 2 mm or greater is not more than 3% by mass, the ratio of microfine particles having a size of less than 106 μm is not more than 5% by mass, and the ratio (D1/D2) of the granule density D1 to the specific gravity D2 of a cured product after curing is in the range of 0.88 or more to 0.97 or less. As a result, the conveyance time was not excessively long, uneven sprinkling, adhesion or the like did not almost occur, and filling properties were also excellent.

The present application claims priorities to Japanese Patent Application No. 2008-314064 filed on Dec. 10, 2008 and Japanese Patent Application No. 2008-314065 filed on Dec. 10, 2008. The contents of the applications are incorporated herein by reference in their entirety.

The invention claimed is:

1. A granular epoxy resin composition for encapsulating a semiconductor element used for a semiconductor device obtained by encapsulating the semiconductor element by compression molding,
wherein, in a particle size distribution of said granular epoxy resin composition as determined by sieving said granular epoxy resin composition for encapsulating the semiconductor element using JIS standard sieves,
a ratio of particles to said granular epoxy resin composition total having a size of 2 mm or greater is not more than 3% by mass,
a ratio of particles to said granular epoxy resin composition total having a size of 1 mm or greater, but less than 2 mm is from 0.5% or more by mass to 60% or less by mass, and
a ratio of microfine particles to said granular epoxy resin composition total having a size of less than 106 μm is not more than 5% by mass.

2. The granular epoxy resin composition for encapsulating the semiconductor element according to claim 1,
wherein, in the particle size of said granular epoxy resin composition distribution as determined by sieving said granular epoxy resin composition for encapsulating the semiconductor element using JIS standard sieves,
a ratio of particles to said granular epoxy resin composition total having a longest length (L) of not more than 5 mm and a shortest length (S) of not more than 1 mm is not less than 50% by mass, based on particles having a size of not less than 106 μm.

3. The granular epoxy resin composition for encapsulating the semiconductor element according to claim 1,
wherein a collapse angle of said granular epoxy resin composition for encapsulating the semiconductor element is not more than 35 degrees.

4. The granular epoxy resin composition for encapsulating the semiconductor element according to claim 1,
wherein said granular epoxy resin composition for encapsulating the semiconductor is obtained by supplying a melted resin composition to the inside of a rotor composed of a cylindrical outer peripheral portion having a plurality of small pores and a disk-shaped bottom surface, and allowing the composition to pass through said small pores by centrifugal force obtained by the rotation of said rotor.

5. A method for producing a semiconductor device, in which the semiconductor element is encapsulated by compression molding using the granular epoxy resin composition for encapsulating the semiconductor element according to claim 1.

6. A semiconductor device obtained by encapsulating a semiconductor element by compression molding using the granular epoxy resin composition for encapsulating the semiconductor element according to claim 1.

7. A semiconductor device comprising a lead frame or a circuit board, one or more semiconductor elements laminated or mounted in parallel on said lead frame or said circuit board, bonding wires for electrically connecting said lead frame or said circuit board and said semiconductor elements, and an encapsulation material for encapsulating said semiconductor elements and said bonding wires,
  wherein a thickness of said encapsulation material on said semiconductor elements is from 0.08 min to 0.5 mm, and said encapsulation material is composed of a cured product of the granular epoxy resin composition for encapsulating the semiconductor element according to claim 1 by compression molding.

8. A granular epoxy resin composition for encapsulating the semiconductor element used for a semiconductor device obtained by encapsulating the semiconductor element by compression molding,
  wherein, in the particle size of said granular epoxy resin composition distribution as determined by sieving said granular epoxy resin composition for encapsulating the semiconductor element using JIS standard sieves,
  a ratio of coarse particles having a size of 2 mm or greater is not more than 3% by mass, a ratio of micro fine particles having a size of less than 106 µm is not more than 5% by mass, and
  a ratio (D1/D2) of a granule density D1 of said epoxy resin composition for encapsulating the semiconductor to the specific gravity D2 of a cured product after curing said epoxy resin composition for encapsulating the semiconductor element is in the range of 0.88 or more to 0.97 or less.

9. The granular epoxy resin composition for encapsulating the semiconductor element according to claim 8, wherein said granule density D1 of said granular epoxy resin composition for encapsulating the semiconductor is not more than 1.95.

* * * * *